United States Patent
Qi et al.

(10) Patent No.: US 10,110,352 B2
(45) Date of Patent: Oct. 23, 2018

(54) RECEIVER FOR RECEIVING DATA IN A BROADCAST SYSTEM

(71) Applicant: Sony Corporation, Tokyo (JP)

(72) Inventors: Junge Qi, Braunschweig (DE); Joerg Robert, Vreden (DE); Jan Zoellner, Braunschweig (DE); Lothar Stadelmeier, Stuttgart (DE); Nabil Loghin, Freiburg (DE)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/610,095

(22) Filed: May 31, 2017

(65) Prior Publication Data

US 2017/0331598 A1 Nov. 16, 2017

Related U.S. Application Data

(63) Continuation of application No. 14/435,556, filed as application No. PCT/EP2013/074733 on Nov. 26, 2013, now Pat. No. 9,692,630.

(30) Foreign Application Priority Data

Nov. 28, 2012 (EP) .................................. 12194677

(51) Int. Cl.
*H04B 7/02* (2018.01)
*H04L 1/02* (2006.01)
(Continued)

(52) U.S. Cl.
CPC ............... *H04L 1/22* (2013.01); *H04H 40/18* (2013.01); *H04L 1/007* (2013.01); *H04L 1/0046* (2013.01);
(Continued)

(58) Field of Classification Search
CPC ...... H04L 1/06; H04L 27/2647; H04B 7/0845; H04B 7/0854; H04B 7/0857
(Continued)

(56) References Cited

U.S. PATENT DOCUMENTS 6,023,615 A * 2/2000 Bruckert ............... H04B 7/082
348/14.08
6,532,562 B1 * 3/2003 Chou .................... H04L 1/0002
714/752
(Continued)

FOREIGN PATENT DOCUMENTS

JP   WO 2011/104182 A2   9/2011
JP   WO 2011104182 A2 *  9/2011  ............ H03M 13/11
(Continued)

OTHER PUBLICATIONS

International Search Report dated Jan. 23, 2014 in PCT/EP13/074733 Filed Nov. 26, 2013.

*Primary Examiner* — James M Perez
(74) *Attorney, Agent, or Firm* — Oblon, McClelland, Maier & Neustadt, L.L.P.

(57) ABSTRACT

A receiver for receiving data in a broadcast system comprises a broadcast receiver that receives via said broadcast system a receiver input data stream comprising a plurality of channel symbols represented by constellation points in a constellation diagram, a demodulator that demodulates said channel symbols into codewords, and a decoder that decodes said codewords into output data words. A redundancy calculator determines a required amount of redundancy data required for correct demodulation and decoding by use of the originally received channel symbol and additional redundancy data. A broadband request unit requests, if demodulation of a channel symbol and/or decoding of a codeword is erroneous or likely to fail, a required amount of redundancy data via a broadband system, that is received by a
(Continued)

broadband receiver via said broadband system. Said demodulator and/or said decoder is configured to use said redundancy data for demodulation and decoding, respectively.

17 Claims, 11 Drawing Sheets

(51) Int. Cl.
    *H04L 1/22*           (2006.01)
    *H04L 27/26*         (2006.01)
    *H04L 1/00*           (2006.01)
    *H04L 1/18*           (2006.01)
    *H04H 40/18*        (2008.01)

(52) U.S. Cl.
    CPC .......... *H04L 1/0086* (2013.01); *H04L 1/1819* (2013.01); *H04L 1/1893* (2013.01); *H04L 27/265* (2013.01)

(58) Field of Classification Search
    USPC ................. 375/130–153, 259–285, 295–352
    See application file for complete search history.

(56) References Cited

U.S. PATENT DOCUMENTS

| | | | | |
|---|---|---|---|---|
| 6,594,798 B1* | 7/2003 | Chou | ................... | H04L 1/0002 714/820 |
| 6,996,097 B1* | 2/2006 | Chou | ................... | H04L 1/0017 370/389 |
| 7,203,227 B1* | 4/2007 | Currivan | ............. | H04L 12/2801 375/222 |
| 7,366,172 B2* | 4/2008 | Chou | ................... | H04L 1/0017 370/389 |
| 7,519,811 B1* | 4/2009 | Hara | ....................... | H04H 20/74 380/200 |
| 7,564,878 B2* | 7/2009 | Stadelmeier | .......... | H04W 16/14 370/329 |
| 7,697,514 B2* | 4/2010 | Chou | ................... | H04L 1/0017 370/389 |
| 8,433,251 B2* | 4/2013 | Chen | ....................... | H04L 5/001 370/255 |
| 8,699,607 B2* | 4/2014 | Seller | .................. | H04L 27/2649 375/256 |
| 8,775,908 B2* | 7/2014 | Loghin | ............... | H03M 13/253 714/776 |
| 8,887,030 B2* | 11/2014 | Loghin | ............... | H03M 13/11 714/758 |
| 8,934,445 B2* | 1/2015 | Li | ......................... | H04L 1/0003 370/329 |
| 8,938,040 B2* | 1/2015 | Alexander | ............ | H04L 1/0045 375/232 |
| 9,077,459 B2* | 7/2015 | Reimers | ............. | H04N 21/2385 |
| 9,131,426 B2* | 9/2015 | Kimura | ................. | H04W 40/02 |
| 9,385,752 B2* | 7/2016 | Loghin | ............... | H03M 13/036 |
| 9,490,887 B2* | 11/2016 | Schneider | ............... | H04B 3/54 |
| 9,538,214 B2* | 1/2017 | Reimers | ............. | H04N 21/2385 |
| 9,692,630 B2* | 6/2017 | Qi | ....................... | H04L 27/2649 |
| 9,755,781 B2* | 9/2017 | Qi | ..................... | H03M 13/6306 |
| 9,838,157 B2* | 12/2017 | Qi | ....................... | H04L 25/0202 |
| 2004/0208255 A1* | 10/2004 | Yoshida | ................. | H04B 7/068 375/260 |
| 2005/0204242 A1* | 9/2005 | Chou | .................... | H04L 1/0017 714/741 |
| 2005/0249211 A1* | 11/2005 | Chou | .................... | H04L 1/0017 370/389 |
| 2006/0168264 A1* | 7/2006 | Baba | .................. | H04L 12/2809 709/230 |
| 2006/0265603 A1* | 11/2006 | McLean | .................. | G06F 21/76 713/189 |
| 2008/0086662 A1* | 4/2008 | Li | ......................... | H04L 1/0003 714/704 |
| 2008/0137718 A1* | 6/2008 | Cha | ....................... | H04L 1/0041 375/146 |
| 2008/0244676 A1* | 10/2008 | DaCosta | ............ | H04N 7/17318 725/116 |
| 2011/0043614 A1* | 2/2011 | Kitazato | ............ | H04N 13/0059 348/51 |
| 2012/0254684 A1* | 10/2012 | Loghin | ............... | H03M 13/253 714/752 |
| 2012/0272117 A1* | 10/2012 | Stadelmeier | .......... | H04L 1/0057 714/752 |
| 2012/0320994 A1* | 12/2012 | Loghin | .................. | H03M 13/11 375/240.27 |
| 2013/0070821 A1* | 3/2013 | Lai | ......................... | H04B 3/542 375/219 |
| 2013/0254828 A1* | 9/2013 | Reimers | ............. | H04N 21/2385 725/134 |
| 2014/0064233 A1* | 3/2014 | Oizumi | ................. | H04L 1/1854 370/329 |
| 2015/0163085 A1* | 6/2015 | Stadelmeier | ........ | H03M 13/356 375/298 |
| 2015/0236818 A1* | 8/2015 | Qi | ......................... | H04L 1/0054 375/341 |
| 2015/0280861 A1* | 10/2015 | Qi | ..................... | H03M 13/6306 714/776 |
| 2015/0288553 A1* | 10/2015 | Qi | ..................... | H03M 13/6306 375/340 |
| 2015/0288990 A1* | 10/2015 | Reimers | ............. | H04N 21/2385 725/109 |
| 2016/0006593 A1* | 1/2016 | Asjadi | ................. | H04L 27/2605 375/295 |
| 2017/0331598 A1* | 11/2017 | Qi | ............................. | H04L 1/22 |
| 2018/0013516 A1* | 1/2018 | Zoellner | ............. | H04L 1/0036 |
| 2018/0048423 A1* | 2/2018 | Qi | ......................... | H04L 1/0054 |

FOREIGN PATENT DOCUMENTS

| | | |
|---|---|---|
| WO | 2008 045845 | 4/2008 |
| WO | 2011 080020 | 7/2011 |

\* cited by examiner

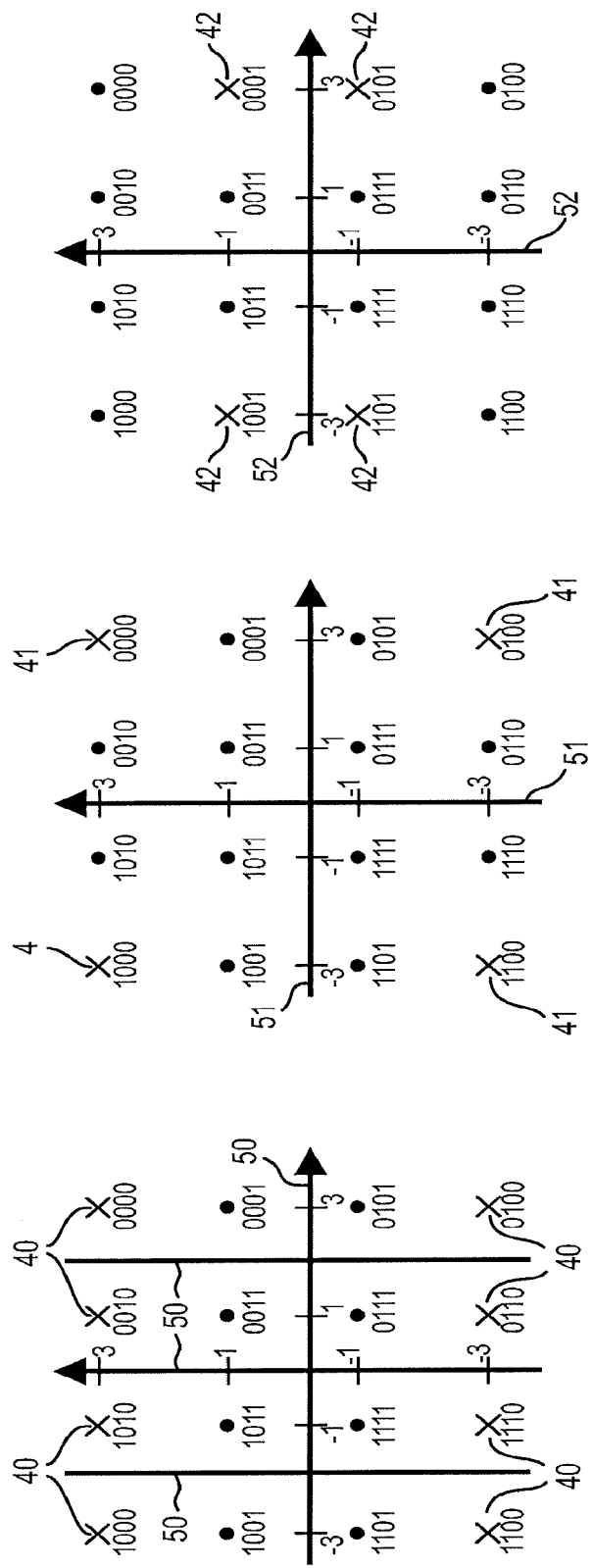

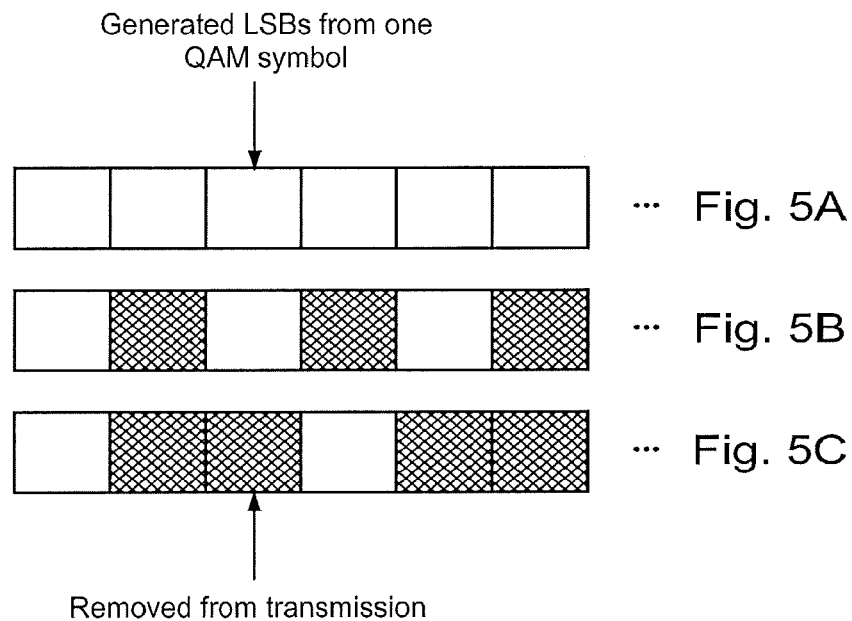
Fig. 5A
Fig. 5B
Fig. 5C
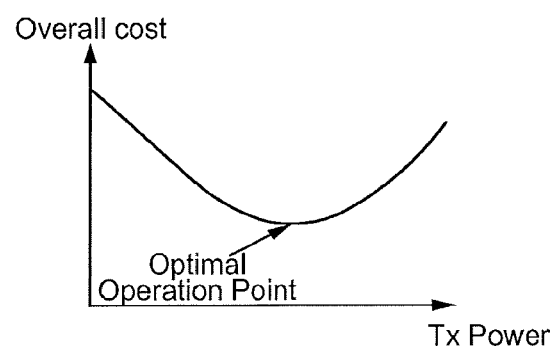
Fig. 10

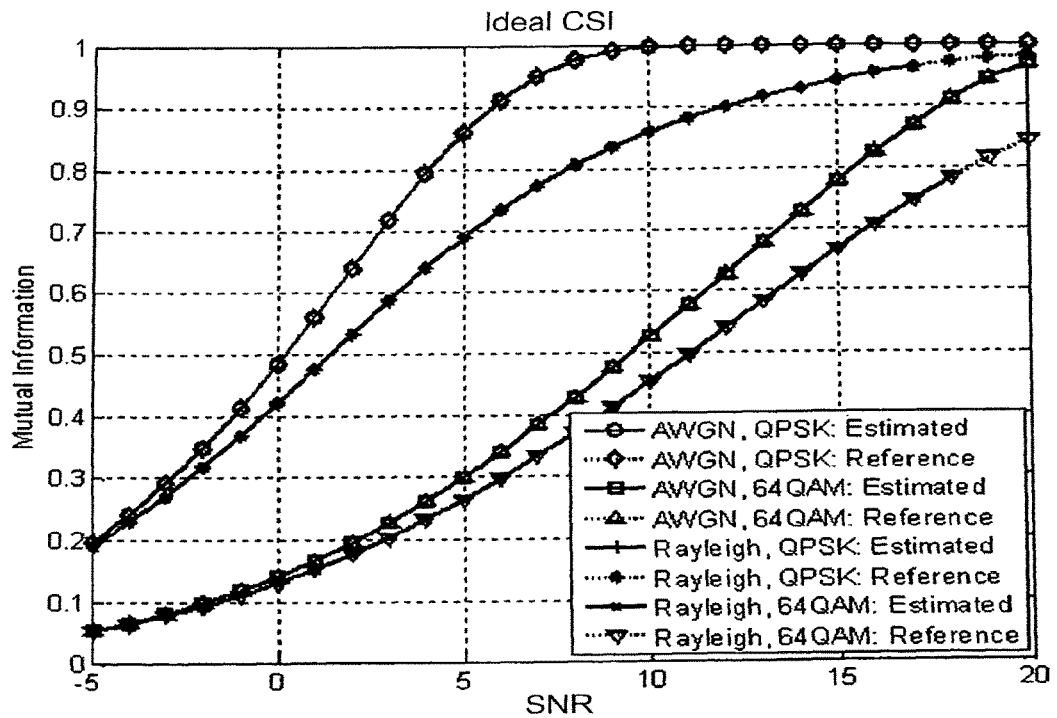
Fig. 15
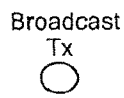
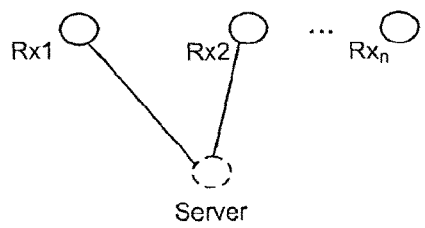
Fig. 17
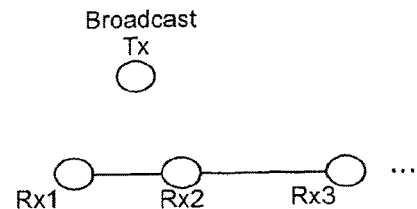
Fig. 18

RECEIVER FOR RECEIVING DATA IN A BROADCAST SYSTEM

CROSS-REFERENCE TO RELATED APPLICATIONS

This application is a continuation of and claims the benefit of priority from U.S. application Ser. No. 14/435,556, filed on Apr. 14, 2015, which is a National Stage Application of U.S. Application No. PCT/EP13/074,733, filed on Nov. 26, 2013, which claims the benefit of priority from European Patent Application No. 12194677.6, filed on Nov. 28, 2012; the entire contents of each of which are incorporated herein by reference.

BACKGROUND

Field of the Disclosure

The present disclosure relates to receiver and a corresponding receiving method for receiving data in a broadcast system. Further, the present disclosure relates to a broadband server and a corresponding method for providing redundancy data and to a broadcast system.

The present invention relates, for instance, to the field of Digital Video Broadcasting (DVB) utilizing Orthogonal Frequency Division Multiplexing (OFDM). Further, the present invention can be applied in other systems, such as a DAB (Digital Audio Broadcasting), DRM, MediaFlo, ISDB, ATSC (e.g. 3.0) or LTE broadcast system.

Description of Related Art

The transmission parameters of known broadcast systems, such as the broadcast systems in accordance with the DVB-T2 standard (second generation digital terrestrial television broadcast systems standard), are generally optimized for fixed reception with stationary receivers, e.g. with roof-top antennas. In future broadcast systems, such as the upcoming DVB-NGH (DVB Next Generation Handheld; in the following also referred to as NGH) standard, a mobile receiver (which is the main focus of this upcoming standard) shall be enabled to receive data correctly also in bad reception situations, e.g. despite suffering from multipath propagation, fading effects and Doppler shifts. Such broadcast systems are particularly characterized by the fact that there is generally no feedback channel and no signalling from receivers to transmitters.

A receiver for receiving data in a broadcast system by which the probability of error-free reception/reconstruction of data by a mobile receiver is increased compared to receivers in known broadcast systems, even under bad reception conditions, is disclosed in WO 2011/080020 A1. The disclosed receiver comprises a broadcast receiver unit for receiving from said broadcast system a receiver input data stream segmented into frames, wherein basic codeword portions of codewords are mapped onto said frames, a codeword comprising said at least a basic codeword portion generated from an input data word according to a first code, a data demapper for demapping the basic codeword portions from said frames of the receiver input data stream, a decoder for error correction code decoding said codewords into output data words of at least one output data stream in a regular decoding step by use of the basic codeword portion comprised in a codeword, a check unit for checking if the regular decoding of a codeword is erroneous, a unicast request unit for requesting, if said regular decoding of a codeword is erroneous, through a unicast system an auxiliary codeword portion of the erroneously decoded codeword for use as incremental redundancy in an additional decoding step, a unicast receiver unit for receiving from said unicast system an auxiliary codeword portion of the erroneously decoded codeword, wherein said decoder is adapted to decode the respective codeword again in an additional decoding step by additionally using the received auxiliary codeword portion, and a data output for outputting said at least one receiver output data stream segmented into said decoded output data words.

The main use of redundancy data is the increase of the coverage area for terrestrial broadcasting. Subscribers located at the edge of the coverage area of a broadcast system (also called broadcast network) are suffering from low receptions levels, which may hinder error-free decoding. This is also true for indoor reception or if large objects attenuate the transmitted signal. To counter this problem the utilization of a (wired or wireless) broadband system (also called broadband network) for providing additional redundancy for enabling error-free reception has been proposed. In many cases only a few dBs received signal level are missing for the correct demodulation and decoding of the broadcast data, resulting in an additional redundancy data stream of few hundred kbit/s. Furthermore other channel impairments like burst noise or narrowband interferer create decoding errors in a sheer broadcast reception scenario which are corrected with the additional redundancy data stream.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present invention.

SUMMARY

It is an object to provide a receiver for receiving data in a broadcast system and a corresponding broadband server for providing redundancy data that enable to further increase the probability of error-free reception/reconstruction of broadcast data without increasing the costs for transmitting too many redundancy data. It is a further object to provide corresponding methods, a broadcast system, as well as a corresponding computer program for implementing said methods and a non-transitory computer-readable recording medium for implementing said methods.

According to an aspect there is provided a receiver for receiving data in a broadcast system comprising:

a broadcast receiver that receives via said broadcast system a receiver input data stream comprising a plurality of channel symbols represented by constellation points in a constellation diagram, a demodulator that demodulates said channel symbols into codewords, a decoder that decodes said codewords into output data words, a redundancy calculator that determines a required amount of redundancy data required for correct demodulation and decoding by use of the originally received channel symbol and additional redundancy data, a broadband request unit that requests, if demodulation of a channel symbol and/or decoding of a codeword is erroneous or likely to fail, a required amount of redundancy data via a broadband system, and a broadband receiver that receives redundancy data via said broadband system, wherein said demodulator and/or said decoder is configured to use said redundancy data to demodulate the respective channel symbol and to decode the respective codeword, respectively.

According to a further aspect there is provided a corresponding receiving method for receiving data in a broadcast system comprising:

receiving via said broadcast system a receiver input data stream comprising a plurality of channel symbols represented by constellation points in a constellation diagram, demodulating said channel symbols into codewords, decoding said codewords into output data words, determining a required amount of redundancy data required for correct demodulation and decoding by use of the originally received channel symbol and additional redundancy data, requesting, if demodulation of a channel symbol and/or decoding of a codeword is erroneous or likely to fail, a required amount of redundancy data via a broadband system, and receiving redundancy data via said broadband system, wherein said redundancy data are used to demodulate the respective channel symbol and to decode the respective codeword, respectively.

According to a further aspect there is provided a broadband server for providing redundancy data to a receiver of a broadcast system via a broadband system, comprising:

a receiving unit that receives requests from receivers of said broadcast system via said broadband system to provide redundancy data to the respective receivers via said broadband system to enable correct demodulation of a channel symbol and/or decoding of a codeword, a request including channel state information, a redundancy calculator that determines the required amount of redundancy data required for correct demodulation and decoding by use of said channel state information, and a transmitting unit that provides redundancy data in at least said required amount to the receiver that requested redundancy data.

According to a further aspect there is provided a method for providing redundancy data to a receiver of a broadcast system via a broadband system, comprising:

receiving requests from receivers of said broadcast system via said broadband system to provide redundancy data to the respective receivers via said broadband system to enable correct demodulation of a channel symbol and/or decoding of a codeword, a request including channel state information, determining the required amount of redundancy data required for correct demodulation and decoding by use of said channel state information, and providing redundancy data in at least said required amount to the receiver that requested redundancy data.

According to still further aspects a broadcast system, a computer program comprising program means for causing a computer to carry out the steps of the method disclosed herein, when said computer program is carried out on a computer, as well as a non-transitory computer-readable recording medium that stores therein a computer program product, which, when executed by a processor, causes the method disclosed herein to be performed are provided.

Preferred embodiments are defined in the dependent claims. It shall be understood that the claimed methods, the claimed broadcast system, the claimed computer program and the claimed computer-readable recording medium have similar and/or identical preferred embodiments as the claimed receiver and/or broadband server and as defined in the dependent claims.

One of the aspects of the disclosure is to make use of the known concept of using redundancy data (in the known system obtained via a unicast system, but generally obtainable via a broadband system) and to further define in which way the optimal amount of redundancy data can best be obtained. This avoids a waste of available resource if only the minimal amount of necessary redundancy data is transmitted.

It is to be understood that both the foregoing general description of the invention and the following detailed description are exemplary, but are not restrictive of the invention.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 4A, 4B and 4C show diagrams illustrating the use of least significant bits as redundancy data, FIGS. 5A, 5B and 5C show diagrams illustrating the use of puncturing according to an embodiment of the present disclosure, FIG. 10 shows a diagram of the relationship between overall cost for transmission and transmitter power consumption, FIG. 15 shows a diagram illustrating the average estimated Mutual Information with and without knowledge of the transmitted bits, FIG. 17 shows a diagram illustrating cooperative decoding with a server controlling the data exchange, and FIG. 18 shows a diagram illustrating cooperative decoding without a server controlling the data exchange.

DESCRIPTION OF THE EMBODIMENTS

Figure 1:
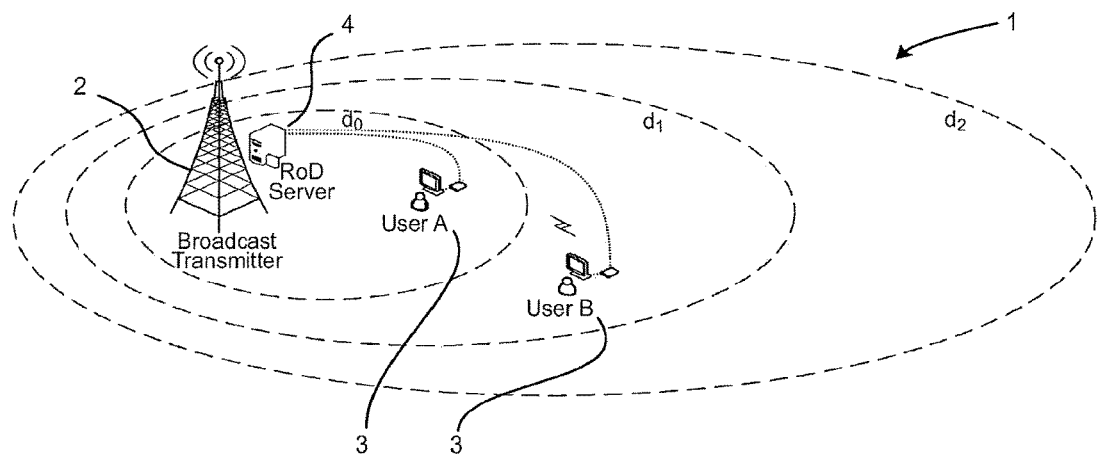
FIG. 1 shows a schematic diagram of a broadcast system according to the present disclosure.

Referring now to the drawings, wherein like reference numerals designate identical or corresponding parts throughout the several views, FIG. 1 shows a schematic diagram of a broadcast system 1 according to the present disclosure. It comprises a broadcast transmitter 2 that transmits, via said broadcast system, a receiver input data stream comprising a plurality of channel symbols represented by constellation points in a constellation diagram. Further, it comprises one or more receivers 3, in this case two receivers indicated as "user A" and "user B" arranged at different distances from the broadcast transmitter 2, according to the present disclosure for receiving data transmitted by the broadcast transmitter 2. Still further, the broadcast system 1 comprises a broadband server 4 (also called broadband provider), in this case a redundancy server that provides redundancy data via a broadband system for reception by said receiver. Due to the use of transmission of data via broadcast and via broadband the broadcast system 1 may also be called a hybrid broadcast system or a broadcast broadband system.

Figure 2:
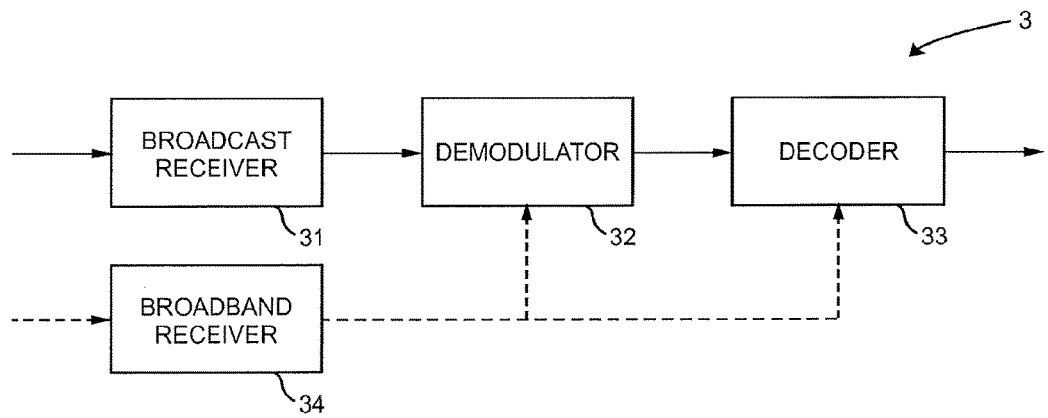
FIG. 2 shows a schematic diagram of a first embodiment of a receiver according to the present disclosure.

FIG. 2 shows a schematic diagram of a receiver 3 according to the present disclosure. It comprises a broadcast receiver 31 that receives, via said broadcast system 1, a receiver input data stream comprising a plurality of channel symbols represented by constellation points in a constellation diagram. A demodulator 32 demodulates said channel symbols into codewords and a decoder 33 decodes said codewords into output data words. A broadband receiver 34 obtains redundancy data via a broadband system, said redundancy data for a channel symbol including one or more least robust bits of the channel symbol or a constellation subset identifier indicating a subset of constellation points including the constellation point representing the channel symbol. According to the present disclosure said demodulator 32 and/or said decoder 33 is configured to use said redundancy data to demodulate the respective channel symbol and to decode the respective codeword, respectively.

In the proposed scheme the transmission in terrestrial network remains unchanged, but for a poor reception the receiver (also called terminal device) can fetch additional data via the broadband network to improve error correction performance. The receiver evaluates the data received from the terrestrial network, and according to the signal quality it requires certain amount of additional data to assure quasi-error-free (QEF) reception. Under more severe conditions more additional data is needed. In this way, for instance, a smooth or seamless transition between pure terrestrial broadcast and complete delivery via the broadband network can be realized. This creates a new degree of freedom for the broadcast network management and may reduce the overall delivery cost and energy consumption.

Figure 3:
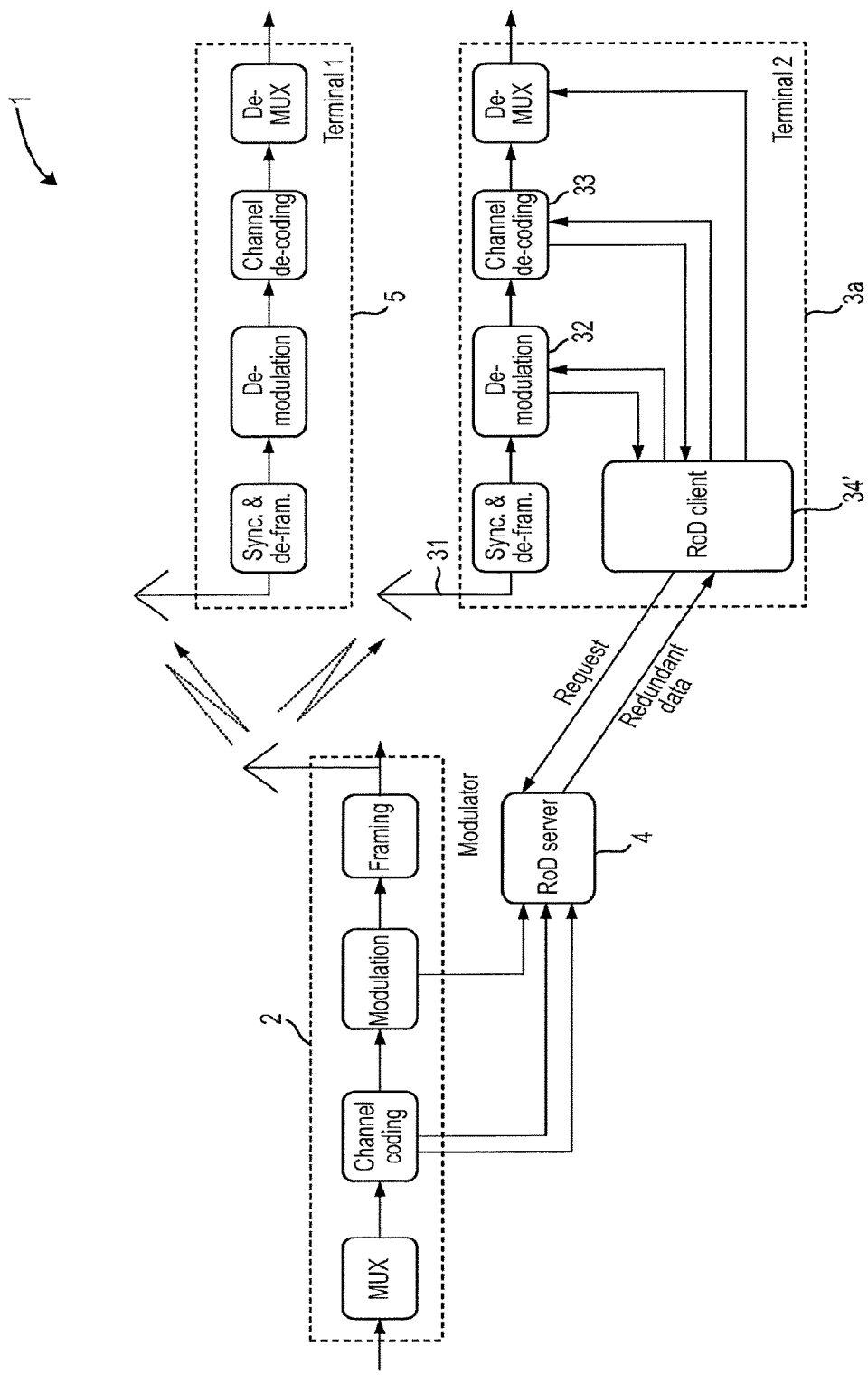
FIG. 3 shows a more detailed diagram of a broadcast system according to the present disclosure.

The data received via both networks is combined for decoding in the receiver. What kind of additional data is transmitted via the broadband network depends on the technology used in the terrestrial broadcast network. FIG. 3 illustrates the proposed broadcast system 1 in more detail, employing the proposed Redundancy on Demand (RoD) concept on the example of DVB-T2. A RoD capable terminal (i.e. a receiver according to the present disclosure) 3a is equipped with a RoD client 34', that substantially corresponds to the broadband receiver 34 (see FIG. 2), that performs a request to the RoD server (i.e. the broadband server) 4 if the reception conditions do not allow for error free decoding based on the data received from the broadcast transmitter 2. The RoD server 4 is then transmitting the required amount of redundancy, which is generally generated from the initially transmitted data stream, to the receiver 3a. Different convergence levels for generating the RoD data are possible, i.e. the transmitted redundancy can either be generated from the output of the multiplexer (MUX), the channel-coding or the modulation block. The proposed RoD scheme is backwards compatible, since receivers that are not capable of a broadband connection for improving the reception remain unchanged, such as the receiver 5 shown in FIG. 3.

A known approach for generating redundancy, which is described in WO 2011/080020 A1, is the retransmission of erroneously received packets with the so cold Automatic Repeat Request (ARQ) scheme. The generation and reinsertion of redundant packets therefore takes place in the multiplexer included in the modulator of the broadcast transmitter 2 (see FIG. 3). Possible convergence levels are e.g. IP-Packets, FEC Frames or Generic Stream Encapsulation (GSE) Packets for DVB-Systems. However, a drawback of this approach is the reduced granularity for generating the redundancy. If the reception conditions are slightly worse than required for error free reception (e.g. 1 dB below the target SNR), each packet needs to be retransmitted via the broadband system requiring a lot of transmission capacity.

Another approach as proposed according to the present disclosure is the usage of the least robust bits (or, generally, the bits having the highest bit error rate, BER), in particular the least significant bits (LSB), of the used constellation (e.g. of a QAM constellation) as redundancy data. The receiver demodulates the QAM constellations, but uses the least robust bits, e.g. the LSBs, from the broadband network instead of the ones from the terrestrial broadcast network, because the least robust bits typically carry the lowest amount of information within the channel symbol (e.g. a QAM symbol).

As the bits from the broadband network are very reliable, the demodulator 32 (in particular the demapper included within the demodulator in various embodiments, e.g. used in OFDM receivers) is able to reduce the number of possible constellation points. Thus, the average Euclidean distance between the remaining constellation points increases, leading to improved performance. This approach is shown in an example in FIG. 4 according to which the LSBs are considered as least robust bits. The LSBs received via the broadband network in the constellation diagram shown in FIG. 4A is 0. The crosses 40 denote the possible constellation points and the lines 50 show the decision thresholds. In the constellation diagrams shown in FIGS. 4B and 4C two LSBs are known (00 and 01), reducing the remaining constellation points 41, 42 (indicated by crosses) to four and reducing the number of decision thresholds 51, 52. The same principle also holds for soft-decision demapping. In this case the knowledge of the redundancy data is used to enhance the reliability of the soft-decision output values of the demapper.

In another embodiment the demodulator 32 is configured to use said least robust bits of a channel symbol received as redundancy data to replace the least robust bits of the channel symbol received by said broadcast receiver to obtain an improved channel symbol and to demodulate said improved channel symbol.

In still another embodiment the receiver can also utilize the least robust bits (e.g. the LSBs) from the broadband network for improving the demapping and/or decoding of the more robust bits (e.g. the MSBs) from the broadcast network. This concept is similar to "Genie-aided" demapping, i.e. an easily implementable soft-decision demapping approach, where the knowledge of the transmitted bits is used to enhance the reliability of the soft-decision output values of the demapper. Thus, the decoder 33 is configured according to this embodiment to use said least robust bits of a channel symbol received as redundancy data to replace obtained input values of the decoder with their ideal values derived from the known bits contained in the redundancy data and, thus, to obtain an improved codeword and to decode said improved codeword. Typically, the input values of the decoder are soft-decision input values (generally log-likelihood ratios, LLRs) so that obtained uncertain soft-decision input values are set to the ideal values having indefinite likelihood (i.e. perfect knowledge) which are then used in the decoding.

The bit rate of the generated redundancy data can be controlled firstly by selecting the number of least robust bits out of each channel symbol, and secondly by puncturing the complete least robust bit stream, as illustrated in FIG. 5. Here, FIG. 5A shows a redundant data stream with bitrate R, FIG. 5B shows a redundant data stream with bitrate R/2, and FIG. 5C shows a redundant data stream with bitrate R/3. This is important to control the optimum amount of redundancy data. On the one hand the amount of transmitted redundancy data must be sufficient to allow for error-free decoding and/or demodulation, but on the other hand the amount should be as low as possible to avoid transmission of unnecessary redundancy data.

Instead of retransmitting the initially transmitted bits, it is also possible to define constellation point subsets that are excluded in the receiver. This allows for increasing the Euclidian distance between the remaining constellation points. If bit sequences with unequal probabilities are transmitted, Huffman coding may be conducted on the selected bits, to enable the receiver to separate them easily and reduce the overhead for the transmission. This is meaningful if constellation shaping is used, altering the probabilities of the subset identifiers, i.e. some subset identifiers occur with higher probability than others. This is directly related to constellation shaping of (e.g. QAM) constellations, with some constellation points occurring with higher probability than others. In the normal case of equal probabilities, Huffman coding does not provide any gain.

An example of a Huffman coding for a 16-QAM constellation is as follows:

| Original bit sequence | Probability | Huffman coded bits |
| --- | --- | --- |
| XXX0 | ½ | 0 |
| XX10 | ¼ | 01 |
| X0X1 | ¼ | 10 |
| 1111 | ¹⁄₁₆ | 11 |

After the identification of the sub-carriers with heavy distortion, redundant bits will be generated from the constellation points of these sub-carriers. Since the distortion levels of these identified sub-carriers may also vary, the redundant bits required for each sub-carrier may also be different.

Figure 6A:
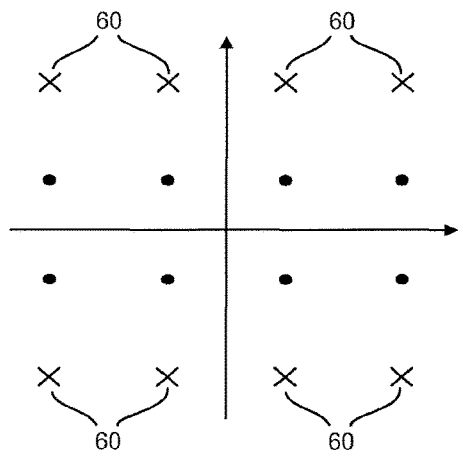
FIGS. 6A and 6B show diagrams illustrating the use of a constellation subset identifier as redundancy data.
Figure 6B:
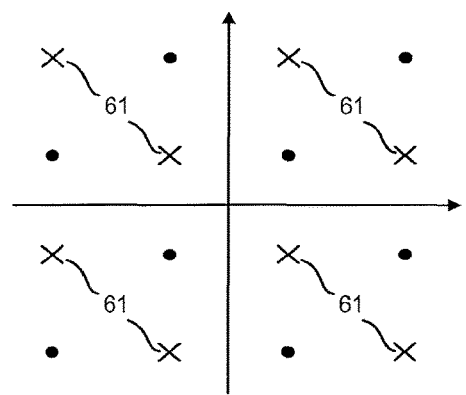

As an example, it shall be supposed that all the N constellation points build a set S. Through the re-labeling S will be divided into sub-sets (S1, S2, . . . , Sm), i.e. not bits but (e.g. QAM) subset identifiers are transmitted. The division operation increases the average robustness of the constellation points within each sub-set. This operation is dependent on the statistical properties of the broadcast signal and the distortion. The mathematical deviation is omitted here. A simple example using 16 constellation points of a QAM constellation is shown in FIG. 6. If the receiver receives a "0" (i.e. 16-QAM Gray Mapping with LSB known to be 0), it indicates the original point locates in a first sub-set comprising the constellation points 60 (indicated by crosses) as shown in FIG. 6A. If the the subsets are optimized for maximum average Euclidian distance, the original point is located in a sub-set comprising the constellation points 61 (indicated by crosses) as shown in FIG. 6B.

The various division schemes for different distortion levels and forms can be pre-calculated and stored in a look-up table to simplify the on-line operation. This approach enables a maximal utilization of the capacity of the communication channel.

Figure 7:
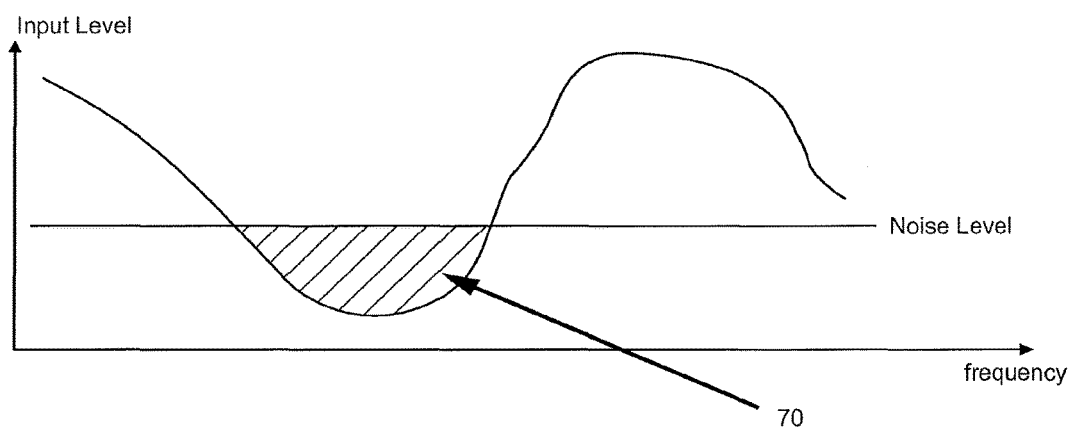
FIG. 7 shows a diagram illustrating the identification of subcarriers having a low CNR.

In a multi-carrier communication system, the distortion each sub-carrier bears varies much in both time domain and frequency domain. In case of portable mobile and stable receptions, the broadcast channel has slow-changing and slow-fading characteristics. Furthermore, low signal power and narrow band interferences are the main hinders for an error-free reception. FIG. 7 illustrates such a broadcast channel exemplarily, in particular the variance of signal strength in frequency domain. The first step is to identify the sub-carriers which are bearing severe distortion and have hence an insufficiently low carrier-to-noise-ratio (CNR). In FIG. 7, they are the ones in the marked area 70. Redundancy data is then only needed for these identified sub-carriers. In this way, the required bandwidth in the broadband network is reduced. Because the channel state may also change temporally, the identification process is carried out periodically or in an event-based manner.

For the sub-carriers with low CNR, some or even all of the bits from their constellation points need to be transmitted by the broadband connection, so that a correct decoding can be achieved. The selection of the bits as redundancy data depends on the distortion, the strength of the signal, the deployed mapping scheme. Moreover, which additional bits should be selected as redundancy data is also dependent on the previously selected bits. A mathematical derivation is omitted here.

Figure 8:
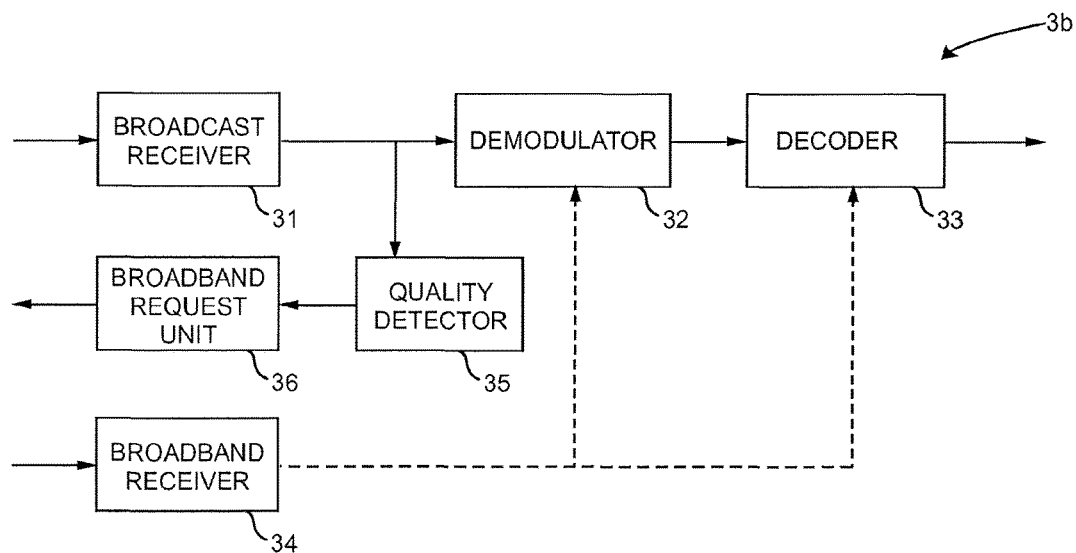
FIG. 8 shows a schematic diagram of a second embodiment of a receiver according to the present disclosure.

An embodiment of a receiver 3b according to the present disclosure making use of this approach in a more general way is shown in FIG. 8. In addition to the receiver 3 it comprises a quality detector 35 that identifies the quality of received channel symbols and a broadband request unit 36 that requests channel symbols having the lowest quality and/or a quality below a predetermined quality threshold as redundancy data.

In a further embodiment, as explained above with reference to FIG. 7, said broadcast receiver 31 is configured to receive said receiver input data stream via a multi-carrier broadcast system, e.g. an OFDM broadcast system (such as a broadcast system in accordance with a DVB standard). Said receiver input data stream comprises a plurality of channel symbols carried by multiple frequency sub-carriers. In this embodiment the quality detector 35 is configured to identify the quality of said frequency sub-carriers, and said broadband request unit 36 is configured to request channel symbols carried by sub-carriers having the lowest quality and/or a quality below a predetermined quality threshold as redundancy data.

In an embodiment the broadband receiver 31 is configured to receive redundancy data via a broadband system. Thus, the broadband server or any other appropriate unit that is able to transmit data through the broadband system thus actively transmits the redundancy data to the receiver. For instance, it can be estimated, e.g. by the broadband transmitter or the broadcast transmitter, if the decoding and/or demodulation at a receiver will be erroneous due to the channel characteristics, so that actively redundancy data will be sent, even without explicit request by the receiver. Further, channel information can be used to select the redundancy data requiring the smallest amount of additional redundancy data.

Figure 9:
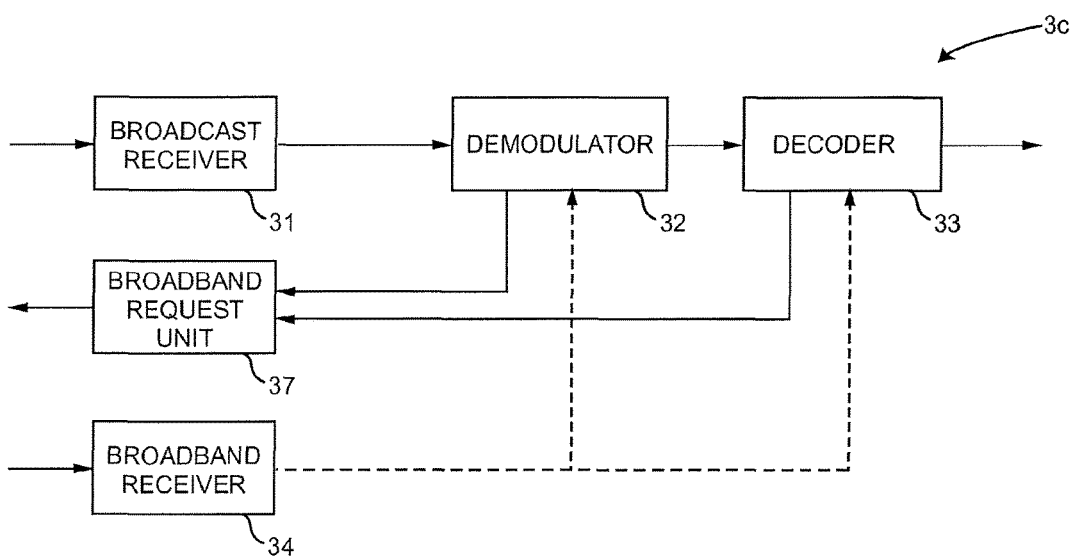
FIG. 9 shows a schematic diagram of a third embodiment of a receiver according to the present disclosure.

In another embodiment, as shown in FIG. 9, the receiver 3c comprises a broadband request unit 37 that requests, if demodulation of a channel symbol and/or decoding of a codeword without redundancy data is erroneous, one or more least robust bits or constellation subset identifiers of the corresponding channel symbol via said broadband system as redundancy data. Thus, the receiver 3c actively requests redundancy data in this embodiment.

Said broadband request unit 37 may alternatively, in another embodiment, transmit receiver specific broadcast channel information via said broadband system to a server (e.g. as shown in FIG. 3) that determines the quality of least robust bits and/or channel symbols received by the broadcast receiver 31 and transmits least robust bits and/or channel symbols as redundancy data to the receiver via said broadband system. Further, preferably, said broadband request unit 37 is configured to compress said channel information by precoding before transmitting it to a server.

In an embodiment the channel state information (CSI) is estimated in the receivers, but the identification of the sub-carriers and the constellation points re-labelling can be carried out in either receivers or the server. If the receiver makes the decisions, it needs only transmit back a request for the specific bits. If the server makes the decisions, the CSI should be transmitted back from the receiver to the server. This CSI can be pre-coded before transmitting. For instance, the CSI can be transmitted incrementally, which means only the difference to last estimation is required by the server. In this case, the CSI can also be seen as two-dimensional spaces with the axis frequency and time. Furthermore, the CSI has specific characteristics in both dimensions, e.g. the variation in the time direction may be very slow in case of stationary reception. Therefore, one could use algorithms similar to MPEG video encoding (e.g. differential encoding) that take benefit of these characteristics for an efficient transmission of the CSI back to the transmitter.

In the following some application scenarios in which embodiments of the present disclosure can be applied will be explained.

When a poor QoS is noticed by the receiver and the availability of the redundancy data is proved, a question may be popped up to the user asking about whether acquiring redundancy data via broadband network is allowed to improve the decoding quality. Once the user accepts this or does choose for permanent allowance, the presentation of the current media content is paused and the broadcast data stream is buffered for a very short interval to equalize the delays in both networks. Then the broadcast data stream and redundancy data stream are synchronized and decoded jointly. Afterwards the media content is displayed without any perceptive errors.

Another advantage of the use of redundancy data is the possibility to efficiently counteract time varying distortions like man-made-noise. Man-made-noise is known to be especially severe in the VHF-Band, causing narrowband as well as broadband distortions that can be either constant over time or time varying. Especially the impact on the QoS of time varying distortions like impulsive noise, which are e.g. caused by switching events of the mains, can be avoided by means of the concept of redundancy data. Heavy noise impulses typically cause a service dropout, since the error correction (e.g. the forward error correction (FeC) as applied in DVB broadcast systems) is not able to correct such strong distortions. This is especially the case for OFDM-based systems, as a short noise impulse in the time domain distorts a complete OFDM symbol in the frequency domain, due to the so called noise-buck effect of OFDM. The VHF band is therefore not used anymore in some countries (like Germany) for digital terrestrial transmission, because of problems with man-made-noise. The use of redundancy data could allow for the reintroduction of terrestrial broadcasting in the VHF-band in such countries.

In current broadcast networks, to achieve a "quasi-error-free" (QEF) viewing experience, a certain level of signal-to-noise ratio (SNR) is required. For receivers which have a poor receiving condition, this SNR threshold cannot be reached, thus a successful decoding of the broadcast signal would be impossible. The TV services can only be provided completely by other means, e.g. IPTV and the corrupted broadcast signal has to be discarded. For the proposed concept of using redundancy data, however, the amount of additional redundancy is dependent on the quality of the broadcast signal: if the distortion is heavier, more redundancy will be needed; if lighter, then less redundancy will be needed. In a worst case, if the desired amount of redundancy data is even larger than that of the original TV content itself, the TV content will be delivered directly to the receiver as a normal IPTV system (100% broadband). Therefore, the data size that have to be transmitted as redundancy data is always less than without using this approach.

Compared to traditional systems, with the concept of redundancy data a soft-transition between pure broadcast and complete IPTV can be realized. This has an influential impact on the network planning, when a high proportion of the receivers are capable of using this concept. For instance, if a certain area shall be covered with a terrestrial broadcasting network and a certain data rate shall be provided in the broadcast channel. Previously, after selecting the network setting (code rate, modulation scheme, etc.) the transmitter power had to be increased to ensure a sufficient SNR at each location in this area. Now, with the concept of redundancy data the transmitter power can be reduced and the receivers located at edge area can be served with some redundancy data via broadband network, so that their demodulation and decoding of the broadcast signal is also "quasi-error-free". Equivalently, the same transmitter power can be maintained, but modulation and error correction rates with higher spectral efficiencies could be applied. The transmitter power can be reduced to a level, when a further decrease of power consumption or transmission cost is no more possible. This power level and the achievable power or cost savings are generally determined by the viewer number, distribution of receivers, cost factors, man-made-noise and so on. Most of these parameters are changing temporally, therefore online monitoring, optimization and adaption are preferably used. For instance, the transmitter power is set to lower level during morning, when less people are watching television. The lower signal strength is compensated by more redundancy data via the broadband network for the relatively small number of receivers.

The relation between the overall power consumption/transmission cost and the transmitter power may look as depicted in FIG. 10. The optimal operation point moves at different time and changes for different network settings, such that a dynamic adaption of the network is meaningful.

Figure 11:
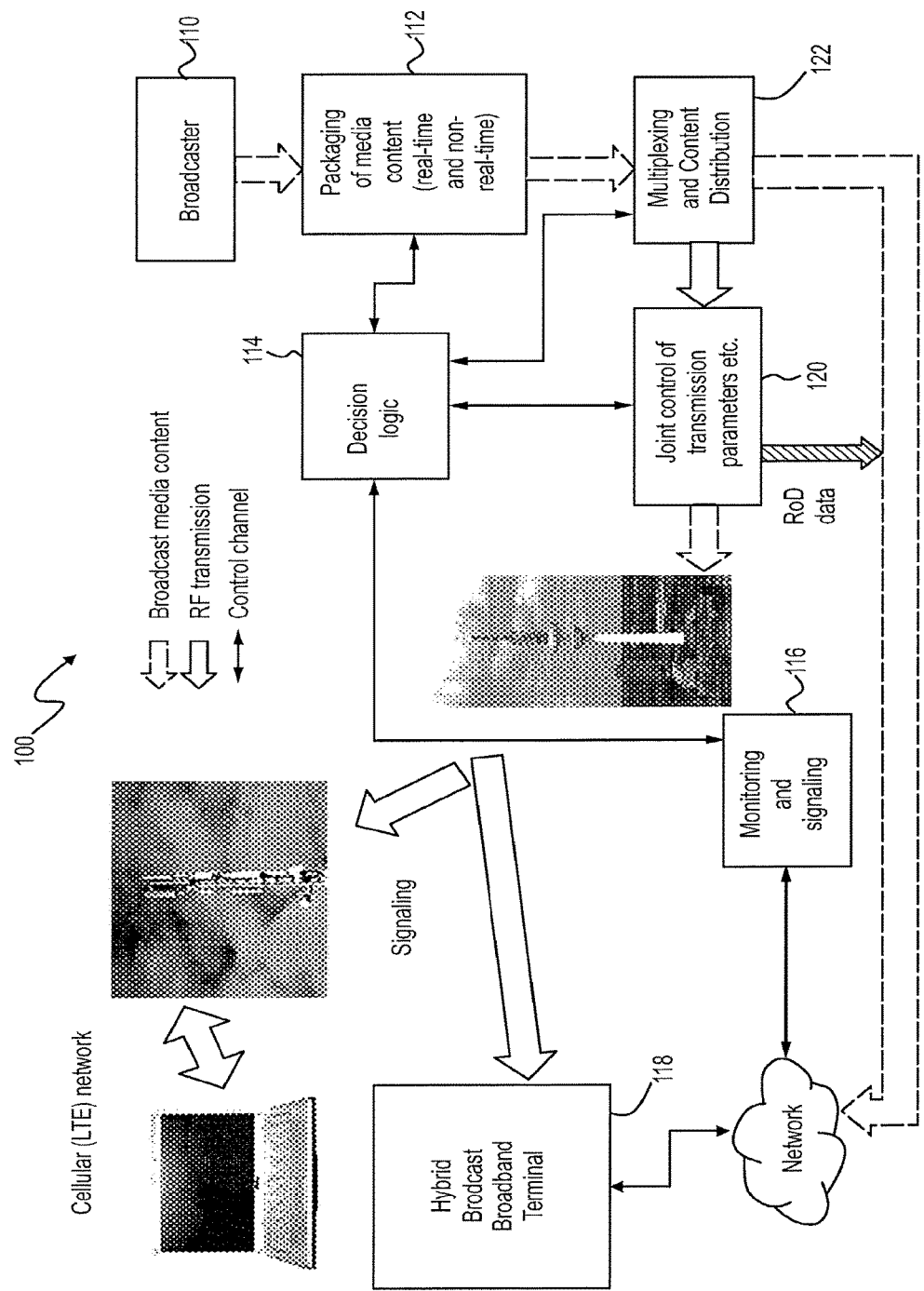
FIG. 11 shows a schematic diagram of a dynamic broadcast system using the present invention.

The proposed ideas can also be applied in a dynamic broadcast system as, for instance, described in U.S. patent application Ser. No. 13/428,743 filed on Mar. 23, 2012, which description is herein incorporated by reference. The so-called dynamic broadcast concept applied in such a dynamic broadcast system describes a flexible terrestrial broadcast system, utilizing an internet broadband connection and a hard disc in the terminal, to optimize the spectrum usage and the power consumption of the transmitter network, by choosing the optimal delivery means depending on the content type (realtime, non-realtime) and the viewer count. The relationship of the concept of redundancy (on demand) with respect to the dynamic broadcast concept is depicted in FIG. 11 showing a schematic diagram of a dynamic broadcast system 100 according to the present disclosure.

The system 100 involves a broadcast (BC) network, a broadband network (BB), hybrid broadcast broadband (HBB) terminals (receivers) and other wireless communication networks. Their cooperation is managed by the dynamic broadcast network. The functions of the blocks shown in FIG. 11 are explained in the following.

First, the packaging of media content unit 112 is described. The TV content is provided by broadcasters 110 and is segmented into Real-Time (RT) and Non-Real-Time (NRT) events. For real-time events, (certain elements of) news programs for instance, their content becomes available only at the announced on-air time, so they have to be delivered live; while for non-real-time events, like movies, music, drama etc., their content may be available in advance, so they can be pre-downloaded. With pre-download (broadcast or broadband) network capacity can be used for instance over night, when capacity has been identified to be available, whereas during daytime and in the evening network capacity will be freed for other uses. The choice of content that can be pre-downloaded will be based on rules used in a decision logic 114. These rules will be generated from usage patterns of viewers derived from information available over the broadband network. In conjunction with other measures the download of such material will take place as network capacity becomes available—either over the broadcast or the broadband network. A program schedule therefore should be created that indicates which content comes over the air in real-time and which content can be played from the storage device in the user terminal.

Next, a monitoring and signaling unit 116 is described. To optimize the network operation, knowledge about actual network usage is important. Two kinds of information should hence be collected from HBB terminals 118 (also called "terminals", "user terminals" or "receivers" hereinafter) and transmitted to the decision logic 114 through broadband connection. The first kind of information is about whether or not programs or pieces of media content are used and by how many people. This popularity can be estimated by monitoring the watching activities of some or all users, as done in today's IPTV networks. Knowing the accurate popularity and usage pattern of the media content can help the decision logic 114 determining which content should be delivered via the broadband network and/or pre-downloaded as mentioned above. The second kind of information is about the momentary technical Quality of Service (QoS) of the transmission links. This can be obtained with integrated measuring devices in HBB terminals 18. With information about the actual signal quality, the decision logic 14 can manage the network most efficiently.

The signaling which delivers data to the HBB terminals 118 will provide information about content items presented for 'delivery in advance' (also called 'offline delivery, i.e. delivery in advance of the official broadcast time), the time of the broadcast transmission and/or the time of play out over the broadband network. It will include a program schedule and it will deliver information about the various parameters selected by the dynamic multiplexing and a joint control unit 120. The signaling information can be transmitted via both networks and in both push and pull modes, so that the HBB terminals 114 can get the current network information even if it is just switched on for the first time.

The decision logic 114 is in charge of the management of the whole network and it aims to keep the operation at a minimal cost while assuring required QoS. Facilitated with the monitoring reports from the HBB terminals 118, and based on additional business rules, cost functions, realistic constraints etc. the decision logic 114 may change the packaging of real-time and non-real-time events, or command a re-multiplexing of the transport streams in broadcast and broadband channels or adjust of the transmission parameters and transmitter power. Before the decision logic 114 has made any changes to the previous program schedule or network settings, it should acknowledge all HBB terminals 18 about the modification through signalling.

Next, a multiplexing and content distribution unit 122 is described. The flexible distribution of media content through broadcast and broadband network requires content items and complete or partial audio, data and video programs to be multiplexed dynamically. In consequence, the former fixed mapping between transmission parameters and TV programs has to be eliminated. Information about such re-multiplexing should be signaled to the HBB terminals 118, so that they are able to follow the changes. By the reason that the popularity of the different TV programs in one transport stream changes continuously, re-multiplexing may take place online, which means some content being transmitted may be reallocated in other physical channels or still in the current channel but with new transmission parameters. All these actions should be carried out in a way unnoticeable by the users.

Next, the joint control unit 120 for control of transmission parameters is described. In traditional digital broadcast systems the modulation of the transmitted signal and the degree of Forward Error Correction (FEC) used are decided once and they then stay stable. The transmitter power is selected according to the coverage requirements of the network. In terrestrial networks, the coverage area is defined by the aforementioned parameters and in addition by the coverage pattern determined by the transmit antenna. This static network planning leads to inefficient usage of the valuable spectrum, because strong time-variant factors like channel popularity and user terminals receiving conditions have not been taken into consideration.

Dynamic multiplexing can reduce the useful data rate transmitted on a specific channel if the multiplex on that channel is not fully loaded with program items at the moment. Initiated by the decision logic 114 the joint control unit 120 will then change the FEC settings and/or modify the modulation scheme used on that channel. This will result in an enhanced robustness of the signal which in consequence will allow the transmitter power to be adapted thus reducing the power density—and the cost of transmission. This creates economical benefits, as well as ecological benefits, since the exposure to radiation and carbon emission will be reduced as a consequence of the lowered transmitter power. In another case, it shall be supposed that signaling provided from user terminals to the broadcast network including information about technical parameters of the received signal in networks indicate a better-than-required or worse-than-required signal quality as a result of changes in man-made noise (i.e. noise generated by any devices used by anybody in the environment)—which has been found to fluctuate greatly and periodically over time—or due to changes in weather conditions. Initiated by the decision logic 114 the joint control unit 120 will modify the parameters (FEC, modulation, transmitter power) in order to accommodate broadcast QoS at a minimum cost. In addition, the joint control unit 120—in negotiation with dynamic multiplexing via the decision logic 114—will initiate the re-configuration of multiplexes such that the data rate transmitted in heavily disturbed channels will be reduced and the robustness of the signal enhanced as required.

In the HBB terminal 118 some content will have to be stored "off-line" upon receipt of the appropriate downstream signaling and besides, which content to store should also be decided by the HBB terminal 118. Therefore it should be capable of predicting user's preferences, storing relevant TV content automatically and managing the stored content dynamically. To accomplish this, a recommender system should be implemented in the HBB terminal 118. On the other hand some content will be made available via the co-operating broadband network. The HBB terminal 118 will receive a program schedule, and a delivery network indicator which indicate for which period of time and how often this stored content is to be used instead of content that in traditional broadcasting would be received live. In addition it will be informed via which of the co-operating networks content will be delivered. The received content from different networks should be managed properly by the HBB terminal 118. Content items are often interrelated. This is obviously true for audio and video but in addition, a plethora of data services like software applications are created by the content owners that will have to be available in the terminal 118 and started, paused or cancelled in relation to the audio and video content. Additional downstream signaling information embedded in the broadcast stream is received by the HBB terminal 18, which indicates the dynamic multiplex configurations and the parameters selected by joint control. Upstream signaling will be generated in HBB terminals 118 for transmission on the broadband network. The user terminal 118 thus becomes an active component of the dynamic broadcast network instead of being a passive device as in traditional broadcasting.

Spectrum freed by dynamic broadcast can be offered to secondary wireless networks, like Cellular (LTE), Wi-Fi, etc. for a certain period of time. To avoid interference, usage of the new "white space" created by dynamic broadcast should be coordinated through resource signaling which is an output of the dynamic broadcast system 100 and informs wireless network operators about the dynamically chosen parameters of the broadcast network. It includes also information about the period of validity of the multiplex configuration and the spectrum resources which will be freed including an indication of the period of time during which the spectrum will be available.

More details about the general concept of dynamic broadcast can be found in the above mentioned US patent application and other publications about dynamic broadcast systems.

As the concept of redundancy on demand provides a "seamless transition" option between complete broadcast or broadband transmission, it can be efficiently combined with the dynamic broadcast concept, introducing another degree of freedom, so that the dynamic broadcast network can be further optimized in the sense of transmission cost, energy consumption, and spectrum efficiency. This is indicated in FIG. 11 by the arrow output by the joint control unit 120 that controls the output of RoD data via the broadband network to the HBB terminal 118.

Redundancy data can also be used in another application as an encryption way to protect the pre-downloaded media content. The pre-download of the media content can be transmitted with a network configuration of high data rate but week error correction. The redundancy data can then be used as a triggering signal to enable the recovery of the original data.

Further, conditional access to data can be realized by use of redundancy data. Conditional access to video services is crucial for pay-TV transmission. Redundancy data can be used to control the access to pay-TV services by means of the broadband connection. The corresponding service is transmitted via terrestrial broadcast to achieve low network cost. However, not the full data rate is transmitted via terrestrial broadcast, but only a specific amount, e.g. like 95% of the data rate. The users that subscribed to the pay-TV service then receive the remaining 5% via the broadband connection as redundancy data. This allows the network operator for restricting the access to the pay-TV service via the broadband connection only to the users with the corresponding service subscription. Other users without the additional redundancy data over broadband are not able to decode the service, since the received Mutual Information via terrestrial broadcast is not sufficient for error free decoding. For this purpose even a slight decrease of the transmitted Mutual Information over the terrestrial broadcast suffices to avoid access of unregistered users to the pay-TV service.

Figure 12:
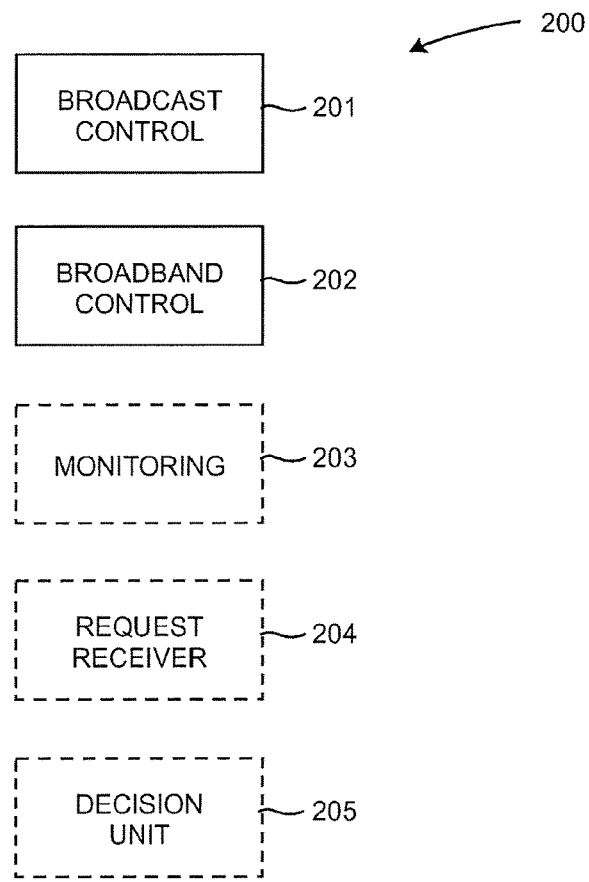
FIG. 12 shows a schematic diagram of a control device for use in a broadcast system according to the present disclosure.

A schematic diagram of a control device 200 for use in a broadcast system according to the present invention is shown in FIG. 12. Such a control device 200 may e.g. be used as joint control unit 120 in the broadcast system 100 shown in FIG. 11. The control device 200 comprises a broadcast control unit 201 and a broadband control unit 202. The broadcast control unit 201 controls a broadcast transmitter of said broadcast system that broadcasts broadcast signals in a coverage area for reception by terminals comprising a broadcast receiver and a broadband receiver. The broadband control unit 202 controls a broadband server of a broadband system that provides redundancy data to terminals within said coverage area. The broadband control unit 202 is configured to control the provision of redundancy data by said broadband server for use by one or more terminals which use said redundancy data together with broadcast signals received via said broadcast system for recovering content received within said broadcast signals and/or provided via said broadband system. Additional optional elements are shown in dashed boxes and will be explained below.

In an embodiment said broadcast control unit 201 is configured to change one or more transmission parameters of said broadcast transmitter depending on one or more parameters of a group of parameters comprising the time of the day, the number, location, profile and/or parameters of active terminals, cost factors of the transmission of data by said broadcast transmitter and/or said broadband server, channel state information (in particular noise and/or reception level) and/or feedback of terminals. Further, said broadband control unit 202 is configured to provide redundancy data to one or more active terminals which receive broadcast signals with insufficient quality and which use said redundancy data to compensate for the insufficient quality of reception of broadcast signals. Optionally, the control device 200 further comprises a monitoring unit 203 that continuously or repeatedly monitors one or more parameters of said group of parameters.

In another embodiment said broadcast control unit 201 is configured to control the transmit power and/or one or more physical layer parameters, in particular modulation and/or code rate, parameters of an interleaver and/or an FFT unit, used by said broadcast transmitter.

In another embodiment said broadcast control unit 201 is configured to adaptively change the transmit power and/or the efficiency of the applied modulation and/or code depending on one or more parameters of a group of parameters comprising the time of the day, the number, location, profile and/or parameters of active terminals, cost factors of the transmission of data by said broadcast transmitter and/or said broadband server, channel state information (in particular noise and/or reception level) and/or feedback of terminals.

In another embodiment said broadband control unit 201 is configured to adaptively change the amount of redundancy data transmitted to one or more active terminals depending on one or more parameters of a group of parameters comprising the time of the day, the number, location, profile and/or parameters of active terminals, cost factors of the transmission of data by said broadcast transmitter and/or said broadband server, channel state information, noise and/or feedback of terminals, preferably depending on the number of active terminals. Preferably, in this embodiment the broadcast control unit 201 is configured to reduce the transmit power and/or to apply a modulation and/or code with a higher efficiency and said broadband control unit is configured to increase the amount of redundancy data transmitted to one or more active terminals if the number of active terminals is below a lower predetermined threshold and/or to decrease the amount of redundancy data transmitted to one or more active terminals if the number of active terminals is above an upper predetermined threshold. Even further, the amount of redundancy data may be controlled based on the costs of the transmission, i.e. based on an estimation if it is more cost efficient to increase or decrease the amount of redundancy data versus use of broadcast for transmitting data.

Still further, in an embodiment the control device 200 comprises an optional request receiving unit 204, as also shown in FIG. 12, that receives requests for transmission of redundancy data from terminals. In this embodiment said broadband control unit 202 is configured to control the broadband server to provide redundancy data to requesting terminals. The requests from terminals may generally differ in the quantity of requested redundancy data, the quality of the requests, the use profiles, etc. For instance, there may be premium users (which may have paid an extra service charge), which may always receive an extra amount of redundancy data in order to ensure a high quality of the transmission in all situations.

In another embodiment the control device 200 is particularly designed for use in a dynamic broadcast system as shown in FIG. 11, wherein said broadcast control unit 201 and said broadband control unit 202 are configured to dynamically control transmission parameters, transmission times and transmission paths used for broadcasting and providing content by use of said broadcast transmitter configured to broadcast content via said broadcast system and/or said broadband server configured to provide content via said broadband system. In this embodiment the control device 200 further comprises an optional decision unit 205 (also shown in FIG. 12) that dynamically decides transmission parameters, transmission times and transmission paths used for broadcasting and providing content by use of said broadcast transmitter and for providing content by said broadband server.

Said decision unit 205 is preferably configured to dynamically decide transmission parameters, transmission times and transmission paths used for broadcasting and providing content based on monitoring data carrying information on user specific content usage and/or transmission quality data carrying information on the quality of a transmission link between said broadband server and a terminal and/or of a reception of content broadcast by said broadcast transmitter.

Further, said redundancy data is preferably provided for providing a seamless transition between broadcast and broadband reception and/or recovery of content from signals received via said broadcast system and said broadband system.

In another embodiment said broadcast control unit 201 and/or said broadband control unit 202 is configured to control said broadcast transmitter and/or said broadband server to transmit content in a form that does not allow complete recovery in a terminal without the use of redundancy data, and to control the transmission of redundancy data via said broadband system to terminals that shall be enabled to completely recover received content.

Preferably, in said embodiment said broadcast control unit 201 and/or said broadband control unit 202 is configured to control said broadcast transmitter and/or said broadband server to transmit content in encrypted form and/or with insufficient and/or low quality and wherein said redundancy data is provided for being used for decryption and/or increasing the quality of the received content. For instance, in an exemplary use scenario, via broadcast a "normal" (lower) image quality (e.g. in SD format) is obtained, while by use of the redundancy data (which may then be regarded as "additional data" or "auxiliary data") received via broadband an "improved" (higher) image quality (e.g. in HD format) is obtained.

Further, in said embodiment said broadcast control unit 201 is preferably configured to control said broadcast transmitter to adaptively change the mutual information between transmitted and received signals to transmit content in a form that does not allow complete recovery in a terminal without the use of redundancy data.

Figure 13:
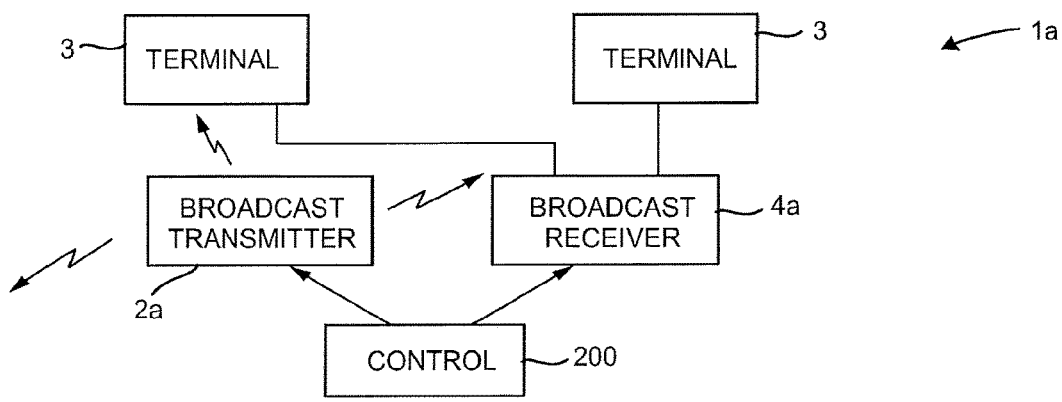
FIG. 13 shows a schematic diagram of another embodiment of a broadcast system according to the present disclosure.

A broadcast system 1a comprising such a control device 200 is schematically depicted in FIG. 13. The broadcast system 1a comprises a broadcast transmitter 2a that broadcasts broadcast signals in a coverage area for reception by terminals 3 comprising a broadcast receiver and a broadband receiver. The broadcast system 1a further comprises a broadband server 4a that provides redundancy data to terminals within said coverage area. Finally, the broadcast system 1a comprises a control device 200 as explained above with reference to FIG. 12 that controls said broadcast transmitter 2a and said broadband server 3a.

Figure 14:
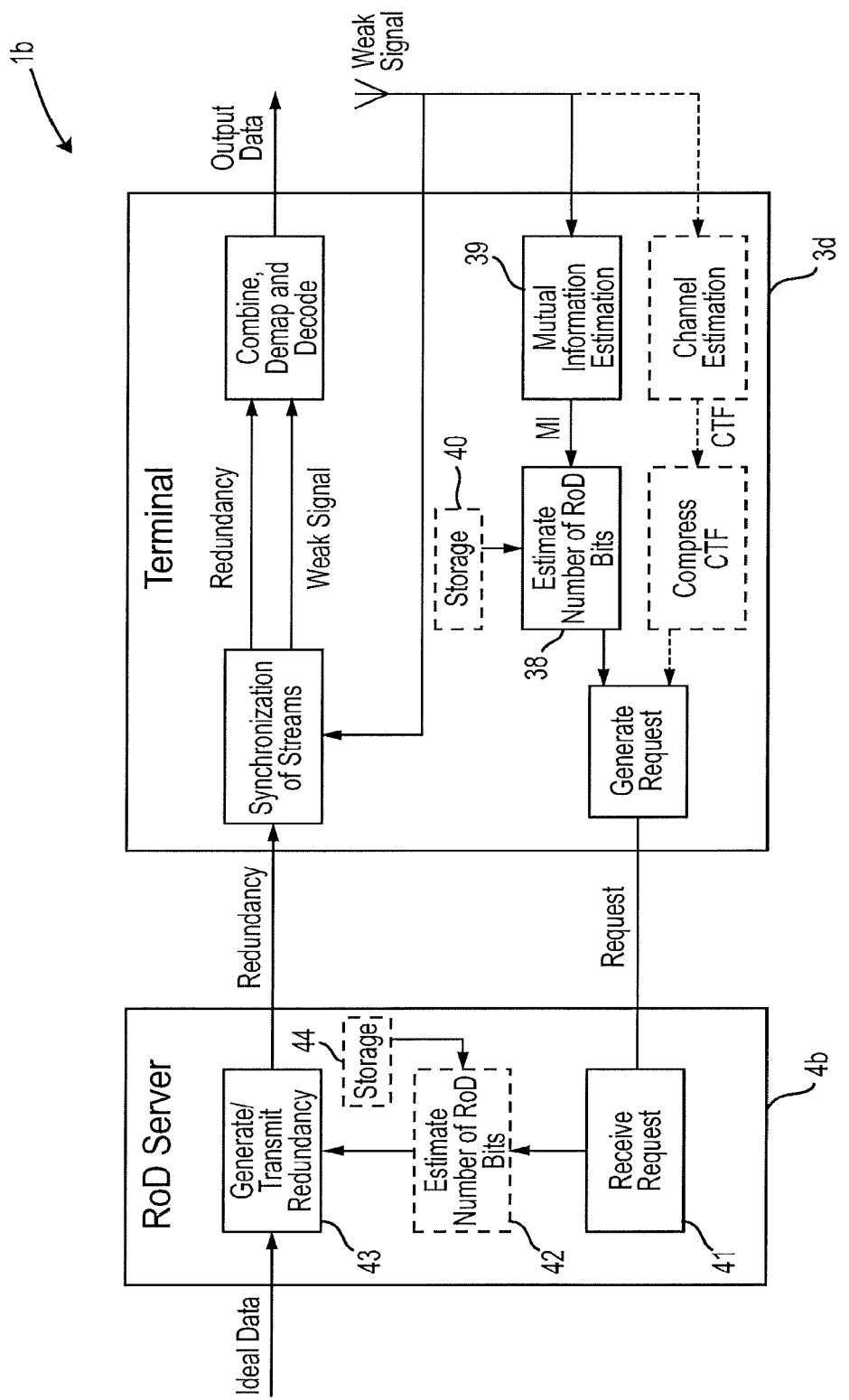
FIG. 14 shows a schematic diagram of another embodiment of a broadcast system according to the present disclosure.

In the following it will be described in more detail how the required amount of redundancy data can be estimated or determined. In particular, the estimation of the Mutual Information, the estimation of the number of redundancy data bits and the stream synchronization will be described by use of various embodiments. The following description will refer to elements shown in FIG. 14 depicting the interaction of a broadband server (called RoD server) 4b and a receiver (called terminal in this embodiment) 3d used in a broadcast system 1b according to the present disclosure.

Generally, a receiver (see also the embodiment of a receiver shown in FIG. 9) for receiving data in such a broadcast system comprises a broadcast receiver (31 in FIG. 9) that receives via said broadcast system a receiver input data stream comprising a plurality of channel symbols represented by constellation points in a constellation diagram, a demodulator (32 in FIG. 9) that demodulates said channel symbols into codewords and a decoder (33 in FIG. 9) that decodes said codewords into output data words. A redundancy calculator (not separately shown in FIG. 9; may be a separate element or included in the broadband request unit 37; separately provided as unit 38 in the receiver 3d shown in FIG. 14) determines a required amount of redundancy data for correct demodulation and decoding by use of the originally received channel symbol and additional redundancy data. A broadband request unit (37 in FIG. 9) requests, if demodulation of a channel symbol and/or decoding of a codeword is erroneous or likely to fail, a required amount of redundancy data via a broadband system and a broadband receiver (34 in FIG. 9) receives redundancy data via said broadband system. The demodulator and/or the decoder are configured to use said redundancy data to demodulate the respective channel symbol and to decode the respective codeword, respectively. These elements are generally also provided in the receiver 3d shown in FIG. 14 even if not explicitly depicted.

The broadband server 4b for providing redundancy data to a receiver of such a broadcast system via said broadband system generally comprises a receiving unit 41 that receives requests from receivers of said broadcast system via said broadband system to provide redundancy data to the respective receivers via said broadband system to enable correct demodulation of a channel symbol and/or decoding of a codeword, a request including channel state information, a redundancy calculator 42 that determines the required amount of redundancy data required for correct demodulation and decoding by use of said channel state information, and a transmitting unit 43 that provides redundancy data in at least said required amount to the receiver that requested redundancy data.

An essential task of a system using redundancy data is to correctly determine the required amount of redundancy data for successful decoding in the terminal (=receiver). If too few redundancy data is transferred from the redundancy provider (i.e. a broadband server) to the terminal, the decoding process will fail and additional redundancy data need to be requested in a second step. This causes network overhead and increases the system delay until successful decoding is achieved due to the multiple redundancy data requests. If on the other hand too much redundancy data is transferred to the terminal, the system efficiency is reduced, since data is transmitted via the broadband connection in vain. The calculation of the correct redundancy data amount is therefore very important, since it influences the performance of the overall system.

A possible metric for the estimation of the required redundancy data amount in the receiver is the Mutual Information (MI) between transmitted (code) bits and received soft values, belonging to one codeword (e.g. a FEC word). The Mutual Information is a figure of merit from stochastic and is especially suited for determining the required amount of redundancy data, since it is independent from the channel characteristics and the modulation order of the QAM constellation, but only depends on the applied code. If the code rate of the applied code is e.g. 0.5, decoding is successful if the Mutual Information exceeds the value of 0.5. However, this only holds for an ideal encoder, operating at the maximum channel capacity (Shannon capacity), which is not possible with practical error correction codes. For instance, the DVB-T2 64K LDPC code with a code rate 0.5 requires a Mutual Information of 0.55 for successful decoding. There are only very slight deviations in the performance of this code depending on the modulation order and the channel characteristics. The required Mutual Information for the utilized codes can be stored in a table in the broadband server or the terminal, such that the required mutual information that needs to be transmitted via redundancy data can be calculated in the terminal or the broadband server. Hence, in an embodiment the redundancy calculator 38 is configured to estimate said required amount of redundancy data based on channel state information and/or Mutual Information between transmitted and received data, in particular between transmitted bits of output data words or codewords and received values representing bits of output data words or codewords.

There are two locations in the receiver where the log-likelihood ratios (LLRs) can be extracted to calculate the Mutual Information: Either directly after QAM demapping or after FEC decoding. If the LLRs after FEC decoding are used, less redundancy data needs to be transmitted in principal (because FEC decoding, though not successful, increases the reliability of the LLRs). Using the estimated Mutual Information it is possible to estimate the meaningfulness to perform FEC decoding. When the Mutual Information is clearly lower than the required Mutual Information for FEC decoding, FEC decoding should be omitted. This is the case because on the one hand the Mutual Information increase by the FEC decoder is typically negligible in such situations, especially for state-of-the-art FEC codes like LDPC or turbo codes, and on the other hand this allows a reduction of the power consumption of the terminal.

The Mutual Information is determined based on the Log-Likelihood-Ratios (LLR) at the output of the QAM-demapper and is a good measure if the following FEC is able to successfully decode the EEC codeword. An LLR is defined here as $$inputLLR = \ln \frac{P(\text{bit} = 1)}{P(\text{bit} = 0)}$$

The Mutual Information of a single Bit based on its LLR value is defined as $MI = 1 - \log 2(1 + e^{-inputLLR})$      If transmitted bit=1:

$MI = 1 - \log 2(1 + e^{+inputLLR})$.      If transmitted bit=0:

The Mutual Information is typically averaged over one FEC block to decide if successful decoding is possible. However, the knowledge of the transmitted bit is required for the calculation, which is not available in a receiver. To avoid the need for the reference data for the calculation of the Mutual Information, the formula is weighted by the linear probability that a 1 or a 0 is transmitted, respectively. The linear probability (in the range [0,1]) that a 1 is transmitted is calculated from its LLR value by $$p = \frac{1}{1+e^{-inputLLR}}.$$

After weighting the initial Mutual Information formulas (assuming bit 1 or bit 0 was transmitted) with the probability p and 1−p, respectively, the following formulas are resulting:

$$MI_1 = 1 - p * \log 2(1 + e^{-inputLLR})$$

$$MI_0 = 1 - (1-p) * \log 2(1 + e^{+inputLLR})$$

The estimated Mutual Information without reference is then resulting from their sum $$MI_{estimated} = MI_1 + MI_0 = 1 - p * \log 2(1 + e^{-inputLLR}) + 1 - (1-p) * \log 2(1 + e^{+inputLLR})$$

The comparison of the Mutual Information estimation with its ideal values is shown in FIG. 15 for different channel models and modulation sizes with a large amount of averaged bits and ideal channel knowledge. It can be observed that estimated Mutual Information exactly corresponds to the ideal Mutual Information. In practice, the Mutual Information is estimated for a particular codeword (or a Time Interleaver Frame, consisting of several codewords), which results in a smaller amount of bits available for averaging. This would result in some degradation of the estimation. Other metrics to compute the amount of required redundancy can be the estimated signal-to-noise ratio (SNR), the average absolute value of the LLRs or the estimated modulation error rate (given by the deviation of the received QAM symbols to the possible transmit QAM symbols).

Based on the estimated mutual information the required number of bits for the redundancy data transmission to the receiver needs to be calculated. This can be done without knowledge of the channel state information (CSI), or taking the CSI into account. If CSI is available at the broadband server, the bits that experienced strong attenuation from the transmission channel are preferably transmitted first. If no CSI is available this is not possible.

To allow for optimum performance of iterative FEC codes, the transmitted redundancy data bits should be uniformly distributed over the FEC codeword. This avoids that the transmitted redundancy data is only located e.g. at the beginning of the FEC codeword. This can be achieved by means of a pseudo random address generator that generates the addresses of the bits within the FEC codeword selected for transmission. Thanks to the random nature of the generated addresses the selected bits are uniformly distributed within the FEC codeword. The random address generator must be known to both the broadband server and the receiver, to allow for unambiguous decoding in the receiver based on the transmitted redundancy data bits. In case of the transmission of least robust bits (e.g. LSBs) first, as explained in an embodiment above, the random addresses of the least robust bits of all QAM symbols that carry a FEC codeword are used for generating the redundancy data bits first. Afterwards the second least robust bits are used, and so on, until the required amount of redundancy data bits is reached.

The calculation of the amount of required redundancy data bits is carried out in the receiver, based on the estimated Mutual Information and the required Mutual Information for successful decoding of the utilized FEC code. The required Mutual Information is known for all code rates (see e.g. FIG. 15 for 64K LDPC of rate ½) by simulation and are stored in the server and the receiver. Depending on the resulting SNR of each received QAM symbol (determined by the CSI), the additional Mutual Information can be calculated that results in the receiver when a particular bit is perfectly known. This additional Mutual Information is added to the available Mutual Information for each pseudo randomly generated bit location until the threshold of the overall Mutual Information for error free decoding is reached. By this means, the number of required redundancy data bits can be assessed in the receiver and a request with this number of bits is sent to the broadband server. The broadband server then uses the same pseudo random address generator to generate the redundancy data bits in the receiver.

As random address generator a linear feedback shift register (LFSR) with a polynomial representing a maximum length sequence (MLS) can be used. For instance for a FEC block size of 64800 the register values generated by a 16-bit LFSR with a cycle length of $2^{16}-1=65535$ could be used. However, only register values smaller or equal to 64800 are used as bit addresses, since the usage of the modulo-operator to truncate larger values could lead to a manifold generation of the same bit address. Other algorithms like the Mersenne-Twister can be used as well, but are not that simple to implement compared to an LFSR. Preferably, the requested bits are only information bits in case the FEC code is systematic. It shall be assumed that the channel completely erased a codeword (of N bits—where K bits are information bits, i.e., the code rate is K/N). In this case, instead of requesting the complete codeword again (N>K), it would be sufficient to retransmit only the information bits (K).

The required number of bits in the receiver can then be computed based on the knowledge of the current Mutual Information. Iteratively new pseudo random bit addresses are generated of bits that are transmitted as redundancy. After each newly generated bit the additional Mutual Information is calculated that results from ideally knowing the additional bit at the generated address in the receiver. The additional Mutual Information is easily accessible from a look up table that can be pre-computed by means of Monte Carlo Simulation. Based on the additional Mutual Information the current Mutual Information is updated by adding the additional Mutual Information. This is iteratively repeated until the current Mutual Information exceeds the required Mutual Information for successful decoding. In pseudo code the algorithm for the calculation of the number of required bits in the receiver is the following:

```
RoD bits to request = 0
while (current mutual information < required mutual information) {
        generate bit address within FEC codeword;
        look up additional mutual information for QAM
        symbol from LUT
        current mutual information = current mutual
    information + additional mutual information
        RoD bits to request = RoD bits to request + 1;
}
```

In short: The algorithm describes a method to estimate the number of retransmitted pseudo random information bits (i.e. without utilizing the channel state information) for error free decoding.

All Mutual Information here corresponds to bitwise mutual information, such that the values are normalized to 1 to allow for direct comparison with the required mutual information value independent of the modulation order.

The table of the additional mutual information per QAM symbol depending on the number of known redundancy data bits within the QAM symbol is stored in the receiver as a look up table (LUT), e.g. in the storage 40. The additional mutual information depends on the SNR of the QAM symbol that carries the bit, and the bits that are known within the QAM symbol. For instance a LUT that stores the additional mutual information for the SNR range of 1 up to 30 dB for 256-QAM requires 30*256=7680 entries. If it is assumed that the LSBs are transmitted first, and so on, only 30*8=240 entries are required, since only 8 states are possible for each QAM symbol (1 bit known, . . . , 8 bits known). The values of the LUT entries are determined by Monte-Carlo simulation in advance, based on the formula of the ideal Mutual Information.

Since the LSBs of QAM symbols carry less Mutual Information and are therefore well suited as redundancy data bits, it is meaningful to optimize the algorithm such that it first generates the bit addresses of the LSBs, then the addresses of the bits with the next lower order within the QAM symbols (LSB−1), and so on. By this means the bits with the highest order, providing the most additional Mutual Information, are transmitted first, reducing the required number of redundancy bits.

Thus, in such an embodiment the redundancy calculator 38 is configured to estimate said required amount of redundancy data based on a comparison between estimated Mutual Information and required Mutual Information for correct demodulation and decoding. For estimating the Mutual Information a mutual information estimation unit 39 is preferably provided. Further, in an embodiment a storage 40 is additionally provided that stores the required Mutual Information for a plurality of codes, in particular for a plurality of code rates and/or codeword lengths.

Accordingly the redundancy calculator 42 of the broadcast server 4b is preferably configured to estimate said required amount of redundancy data based on channel state information and/or Mutual Information between transmitted and received data, in particular between transmitted bits of output data words or codewords and received values representing bits of output data words or codewords. Further, the redundancy calculator 42 is preferably configured to estimate said required amount of redundancy data based on a comparison between estimated Mutual Information and required Mutual Information for correct demodulation and decoding. Still further, preferably a storage 44 is provided that stores the required Mutual Information for a plurality of codes, in particular for a plurality of code rates and/or codeword lengths.

The algorithm above requires a lot of computations to determine the number of required bits, since the mutual information must be calculated for every additional bit per QAM symbol, to reflect the actual noise of each QAM symbol. However, the algorithm can be simplified by assuming an average noise level throughout the FEC codeword. Based on the average noise level the average additional Mutual Information is calculated for the current bit order (LSBs transmitted first). Based on the average Mutual Information the number of additional bits is calculated to provide the amount of required Mutual Information for error free decoding. If the number of required bits of this bit order is not sufficient, all bits of this bit order are flagged for transmission and this is the same is then iteratively calculated for the next bit order, and so on. If the current bit order provides enough bits to bridge the remaining gap to the required Mutual Information, the number of redundancy bits is calculated by adding the (N/M) bits for each bit order that is completely transmitted, plus the additionally required bits of the current bit order. This algorithm requires only one calculation for each of the M bit levels, instead of one calculation per bit, since the additional Mutual Information for each bit order is assumed to be the same throughout all (N/M) bits of this bit order. The pseudocode for this simplified calculation of the required number of bits is the following:

```
If (current MI < required MI) {
    missing MI = required MI − current MI;
    for (int i = 0; i < M; i++) {
        get additional MI from LUT (additional MI per QAM symbol if
            i+1 Bits are known instead of only i Bits, assuming
            an average SNR for all QAM symbols)
        calculate the number of required QAM symbols to bridge the gap of
            missing MI if one additional bit is known
        if (number of required QAM symbols < N/M) {
            RoD bits to request = i * (N/M) + number of required QAM
            symbols;
            break;
        }
        else {
            current MI = current MI + additional MI * (N/M)
            missing MI = required MI − current MI;
        }
    }
}
```

In short: The algorithm describes a method to estimate the number of retransmitted pseudo random information bits (i.e. without utilizing the channel state information) for error free decoding, with reduced computational complexity but also reduced accuracy compared to algorithm 1.

Thus, in such an embodiment the redundancy calculator 38 of the receiver 3d is configured to determine an average additional Mutual Information for a channel symbol and to add said average additional Mutual Information to available Mutual Information for each bit location of a particular codeword until a threshold of an overall Mutual Information required for correct decoding is reached and to determine the required amount of redundancy data required for correct decoding of said particular codeword based thereon. Accordingly, the redundancy calculator 42 of the broadband server 4b is configured to determine an average additional Mutual Information for a channel symbol and to add said average additional Mutual Information to available Mutual Information for each bit location of a particular codeword until a threshold of an overall Mutual Information required for correct decoding is reached and to determine the required amount of redundancy data required for correct decoding of said particular codeword based thereon.

Alternatively, the following calculation of the required number of redundancy based on estimated Mutual Information can be used, if it is assumed that the redundancy consists of already transmitted code bits.

The estimated Mutual Information shall be denoted as $MI_{old}$, the required number of redundancy data as n, the number of bits in the codeword as N (e.g., N=64800 in a 64 k LDPC). The new Mutual Information $MI_{new}$ after n (already transmitted) redundant bits have been re-transmitted via a unicast system (generally, the broadband system) is then obtained by:

$$MI_{new} = \frac{n}{N} \cdot 1 + \left(1 - \frac{n}{N}\right) \cdot MI_{old} = \frac{n}{N} + \frac{N-n}{N} \cdot MI_{old}$$

The n redundant bits from the broadband server are received with substantially perfect knowledge, since a unicast system can guarantee error-free transmission. The formula is due to the mixing property of the EXIT chart, see "A.

Ashikhmin, G. Kramer, and S. ten Brink, "Extrinsic information transfer functions: model and erasure channel properties," IEEE Trans. Inform. Theory, vol. 50, no. 11, pp. 2657-2673, November 2004.

From the previous formula, it is obtained:

$$n = \begin{cases} N \cdot \frac{(MI_{new} - MI_{old})}{1 - MI_{old}} & \text{if } MI_{new} < MI_{old} \\ 0 & \text{else} \end{cases}$$

n will be lower bounded by 0 (if MIold>MInew) and upper bounded by the number of information bits K in the codeword, if MInew is set to the code rate (or slightly above) R=K/N, in case MIold=0.

In short: The formula computes the amount n of redundancy that has to be retransmitted. The new Mutual Information is computed, which is the weighted sum of the old Mutual Information and perfect Mutual Information for those n bits, and compared with the desired Mutual Information that is required for successful decoding.

If the CSI of the receiver is available at the broadband server, the calculation of the required redundancy data bits can alternatively be carried out in the server. The receiver then first transmits the CSI to the server (a possible CSI compression scheme is described below). Based on the SNR of each QAM symbol (determined from the CSI), the server is able to find the bit in the FEC codeword by means of the LUT that provides the largest additional mutual information. This way the bits that experienced deep fading are used first as redundancy data bits, since the additional mutual information of these bits is the largest. The algorithm is very similar to the algorithm without CSI knowledge. The important difference is that instead of pseudo random bits, the bits providing the maximum additional information are used as redundancy bits. This is iteratively repeated until the threshold of the required Mutual Information for error free decoding is reached. The algorithm for the calculation of the redundancy data bits in the server based on the receivers CSI in pseudo code is the following:

```
RoD bits to request = 0
while (current MI < required MI) {
    for (all bits in FEC codeword) {
        find bit with maximum additional MI (by means of LUT)
    }
        current   MI   =   current   MI   +   additional
        MI RoD bits to request = RoD bits to request + 1;
}
```

In short: The algorithm describes a method to estimate the number of retransmitted bits for error free decoding, based on the channel state information, with optimum performance, but high computational complexity.

Thus, in such an embodiment the redundancy calculator 38 is configured to add additional Mutual Information resulting in the receiver, when a particular bit is known, to available Mutual Information for each bit location of a particular codeword until a threshold of an overall Mutual Information required for correct decoding is reached and to determine the required amount of redundancy data required for correct decoding of said particular codeword based thereon. Preferably, said redundancy calculator 38 is configured to determine said additional Mutual Information for several or all bits of a channel symbol. Also in such an embodiment the receiver 3d preferably comprises a storage 40 that stores said additional Mutual Information for a plurality of codes, in particular for a plurality of code rates and/or codeword lengths.

Accordingly, in such an embodiment the redundancy calculator 42 is configured to add additional Mutual Information resulting in the receiver, when a particular bit is known, to available Mutual Information for each bit location of a particular codeword until a threshold of an overall Mutual Information required for correct decoding is reached and to determine the required amount of redundancy data required for correct decoding of said particular codeword based thereon. Further, preferably the redundancy calculator 42 is configured to determine said additional Mutual Information for several or all bits of a channel symbol. Still further, preferably a storage 44 is provided that stores said additional Mutual Information for a plurality of codes, in particular for a plurality of code rates and/or codeword lengths. In still another embodiment the redundancy calculator 42 is configured to use bits of a channel symbol providing the maximum additional Mutual Information, resulting in the receiver, when a particular bit is known, as redundancy data. In a similar way, the receiver could, using channel state information, determine the required number of bits of a channel symbol providing the maximum additional Mutual Information.

The broadband server then transmits the redundancy data bits to the receiver via broadband, which is then able to calculate the positions of the redundancy data bit within the FEC codeword with the same algorithm that has been used in the redundancy data server to generate the bits. The receiver is then able to recombine and decode the FEC codeword.

To reduce the number of comparisons to find the optimal bit from the LUT, the LSBs only can be transmitted first, then the bits at bit position LSB−1 within the QAM symbol, and so on, since these bits have a high probability to carry the lowest Mutual Information. This is neglected in the pseudo code for simplicity.

In principle it is also possible to determine the number of required bits based on other parameters like SNR or MER. However, SNR and MER do not allow for such an accurate estimation taking the CSI into account. Rough numbers for the required RoD amount must be stored in the server and receiver that have been determined by simulation for different delta SNR values (required SNR−actual SNR). That is, the estimation of the required number of redundancy data bits based on SNR or MER is less accurate compared to the Mutual Information and therefore not well suited here.

In the following synchronization between receiver and broadband server will be explained.

The signaling about how the received data must be combined in the receiver generally takes place in the broadband network. As a result the frame structure employed in the broadcast network does not necessarily need any extension. However, at the physical layer an identification of the FEC-encoded data segments is required for the synchronization between the data from both terrestrial and broadband networks. Besides, at the application layer the redundancy data can be signaled as an additional service, therefore a linkage to the respective original service shall be given.

Current terrestrial broadcasting systems like DVB-T or DVB-T2 contain no suitable mechanism for a unique identification of FEC packets/BBFrames, although the available timestamp of DVB-T2 (ISSY counter) might be applicable to some extent. However the limited time range of the ISSY counter might prevent a reliable packet identification An unambiguous mechanism is therefore required to inform the broadband server, which BBFrames could not be correctly decoded. One solution would e.g. be a counter related to each FEC packet, whose value is increased after each FEC packet, allowing for the unique identification of a FEC packet. If it is intended to introduce the concept of using redundancy (on demand; RoD) in broadcasting systems without such unique packet identification alternative approaches need to be used. A specific amount of soft- Based on this formula the required number of bits can easily be calculated for a given maximum misdetection probability p and the number of FEC packets the identification is carried out with. The misdetection probability p is given in the following table for exemplary values of m and n. It becomes clear that increasing the fingerprint length m, decreases the probability for misdetection.

| | n | | | | | | | |
|---|---|---|---|---|---|---|---|---|
| m | 8 | 16 | 24 | 32 | 40 | 48 | 56 | 64 |
| 2 | 3.91E−03 | 1.53E−05 | 5.96E−08 | 2.33E−10 | 9.09E−13 | 3.55E−15 | 1.39E−17 | 5.42E−20 |
| 10 | 1.63E−01 | 0.00068644 | 2.68E−06 | 1.05E−08 | 4.09E−11 | 1.60E−13 | 6.25E−16 | 2.44E−18 |
| 25 | 0.702147 | 0.00456774 | 1.79E−05 | 6.98E−08 | 2.73E−10 | 1.07E−12 | 4.16E−15 | 1.63E−17 |
| 100 | 1 | 0.0727845 | 0.000295 | 1.15E−06 | 4.50E−09 | 1.76E−11 | 6.87E−14 | 2.68E−16 |
| 250 | 1 | 0.378447 | 0.00185348 | 7.25E−06 | 2.83E−08 | 1.11E−10 | 4.32E−13 | 1.69E−15 |
| 1000 | 1 | 0.999529 | 0.0293343 | 0.000116292 | 4.54E−07 | 1.77E−09 | 6.93E−12 | 2.71E−14 |
| 2500 | 1 | 1 | 0.169892 | 0.00072704 | 2.84E−06 | 1.11E−08 | 4.34E−11 | 1.69E−13 |
| 10000 | 1 | 1 | 0.949234 | 0.0115729 | 4.55E−05 | 1.78E−07 | 6.94E−10 | 2.71E−12 | information (LLR) values of the LDPC or BCH parity block (in case of DVB-T2) of the erroneous packet can be used as a fingerprint that identifies the packet. This is possible, since even a slight difference in the payload between packets leads to different parity blocks. Based on the sequence of LLR values, the broadband server can perform a correlation to achieve the synchronization. This allows for the synchronization between broadband server and the receiver even if the required SNR in the receiver is too low to decode any FEC packets correctly.

Figure 16:
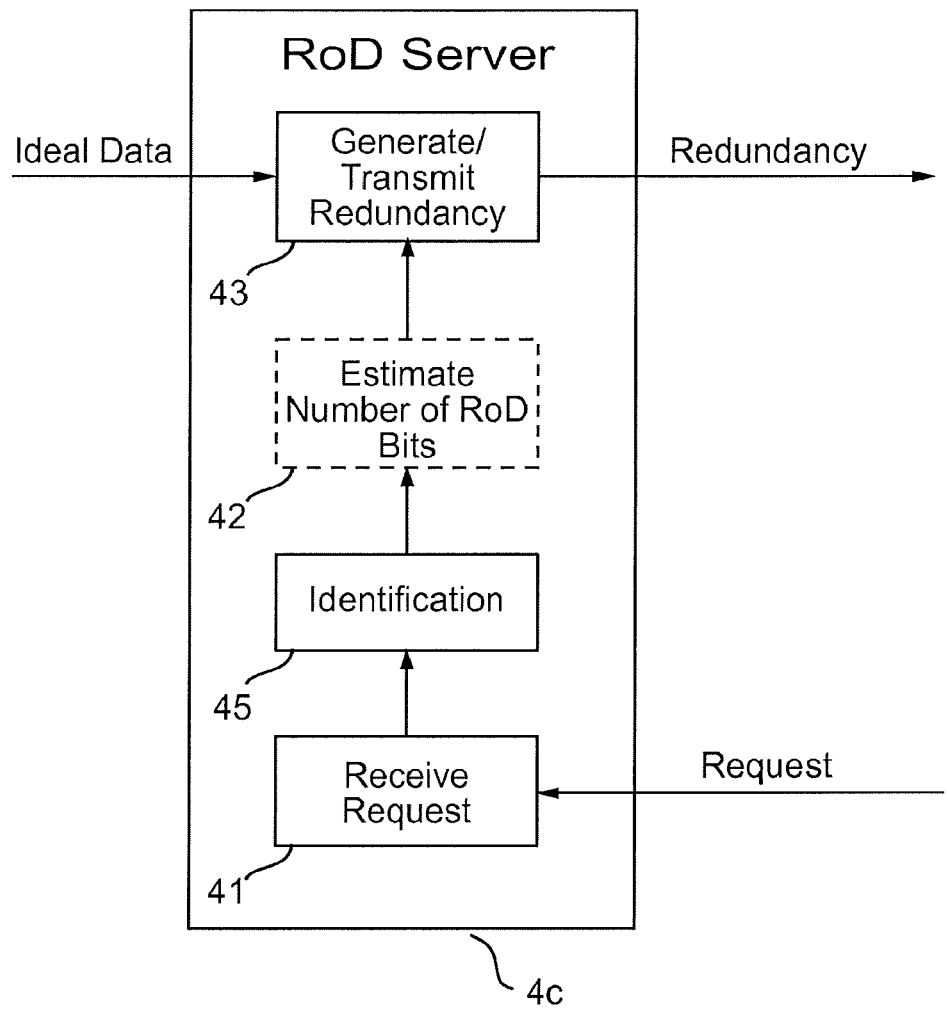
FIG. 16 shows a schematic diagram of another embodiment of a broadcast server according to the present disclosure.

Thus, in an embodiment of a broadband server 4c depicted in FIG. 16 it comprises, in addition to the elements of the broadband server 4b shown in FIG. 14, an identification unit 45 that identifies a data packet for which redundancy data shall be determined by use of a correlation using soft information values of data of said data packet, in particular of parity data, contained in a request received from a receiver, wherein said redundancy calculator 42 is configured to use the information about the identity of the data packet to determine redundancy data for said data packet. In the same way, the receiver could identify the data packet to which received redundancy data belong based on the correlation using soft information of the demodulator and/or the decoder.

If the receiver was already able to decode some FEC packets, the transmission of soft-information for correlation in the broadband server is not necessary, since a subset of the parity blocks of correctly decoded preceding FEC packets can be used for packet identification. In such cases the known and hard decided fingerprint of the last correctly received packet and the number of erroneous packets is transmitted to the broadband server, which then sends the required amount of redundancy for the requested packets. For this identification approach even a small amount of bits is sufficient, since no correlation in the receiver is required. It must only be assured that the fingerprint uniquely identifies the FEC packet. Assuming that the parity blocks are binary sequences with equal distribution, the probability that a fingerprint sequence with length n is not unique form preceding FEC packets is $$p = 1 - \prod_{k=1}^{m}\left(\frac{1}{2^n}(2^n - k + 1)\right).$$

However, the success rate can be further increased if the frame number and the number of the FEC block within the frame are transmitted.

Thus, in such an embodiment of a broadband server 4c depicted in FIG. 16 the identification unit 45 identifies a data packet for which redundancy data shall be determined by use of a number of bits, in particular parity bits, of the last correctly decoded codewords contained in a request received from a receiver. Further, the redundancy calculator 42 is configured to use the information about the identity of the data packet to determine redundancy data for said data packet. In another embodiment a packet counter or a timestamp (ISSY) can be used for packet identification.

In the following cooperative decoding with distributed receivers will be explained.

Most TV devices nowadays are integrated with terrestrial broadcast receiver. But the TV devices work alone with the locally received signals. However, as home networks are being installed in more and more household, the receivers can be connected to each other as well, so that a cooperative decoding of the broadcast signal becomes realizable. A space-diversity will be created when the receivers can carry out the decoding jointly and thus an improvement of the signal quality will also be possible. This concept is operating without a server that has perfect knowledge of the transmitted signal. Instead the redundancy data is generated in a cooperative fashion.

In the embodiment of a broadcast system shown in FIG. 17, n receivers Rx1, Rx2, . . . , R are connected via a server, which may be located separately or together with one of the receivers. After receiving the broadcast signal each receiver checks whether and where (temporally or spectrally) redundancy data is required and makes a request to the server. Having the requests from each receiver, the server requires the necessary data from each receiver, encode it, and distribute it to the receivers that need it.

Assuming an example with two receivers, Rx1 and Rx2, three cases may happen to each signal part (temporally or spectrally).

1. Both receivers can decode it correctly by themselves. No data exchange is needed in this case.
2. Both receivers cannot decode it correctly by themselves. The LLRs of the signal are quantized and transmitted to the server, who adds them together and multicasts the signal to both receivers. Afterwards the receivers precede the decoding process with help of the received LLRs.

3. One receiver can decode it correctly by itself while the other not. In best case, another signal part can be found where the situation is reversed and the LLRs of these two signal parts can be added and forwarded by the server. Then each receiver can achieve the desired part by subtracting their own signal (network coding alike).

For example:

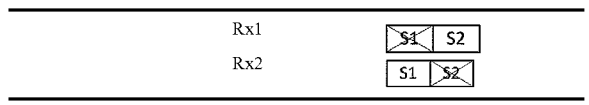

Rx1 send S2 and Rx2 send S1' to the server. The server transmitted then S2+S1 back to each receiver, which can get the desired signal with subtraction.

Such a broadcast system thus comprises a broadcast transmitter that broadcasts broadcast signals in a coverage area for reception by terminals comprising a broadcast receiver and a broadband receiver, a broadband server that provides redundancy data to terminals within said coverage area, and one or more terminals comprising a broadcast receiver and a broadband receiver, wherein said broadband server is configured to obtain redundancy data required by a terminal from one or more other terminals.

The information exchange can take place autonomously when the receivers are somehow connected to each other (e.g. by a home network via Ethernet) such that a distributed network is resulting. This approach is shown in FIG. 18. In this case, the server is not necessary and data request, coding and flow control are controlled by receivers themselves. Such a broadcast system thus comprises a broadcast transmitter that broadcasts broadcast signals in a coverage area for reception by terminals comprising a broadcast receiver and a broadband receiver, and one or more terminals comprising a broadcast receiver, wherein said terminals are configured to obtain redundancy data required by a terminal from one or more other terminals.

Obviously, numerous modifications and variations of the present disclosure are possible in light of the above teachings. It is therefore to be understood that within the scope of the appended claims, the invention may be practiced otherwise than as specifically described herein.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the invention have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present invention. Further, such a software may also be distributed in other forms, such as via the Internet or other wired or wireless telecommunication systems.

The elements of the claimed devices and apparatus may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

Any reference signs in the claims should not be construed as limiting the scope.

The invention claimed is:

1. A receiver comprising circuitry configured to:
receive, via broadcast receiver circuitry, in a broadcast signal OFDM symbols representing a content item for a non-real-time event;
decode the content item and determine whether complete decoding of the content item is possible;
in response to a determination result that complete decoding of the content item based on the received OFDM symbols is not possible,
send a request to a server for redundancy data corresponds to specifically requested bit positions in the received broadcast signal,
receive the requested redundancy data via broadband receiver circuitry, and
complete the decoding of the content item based on the received redundancy data; and
play the content item as the non-real time event.

2. The receiver as claimed in claim 1 wherein the content item is a data service item.

3. The receiver as claimed in claim 2, wherein the data service item is related to a video content item received via the broadcast circuitry and under the control of the circuitry is started in relation to the video content item.

4. The receiver as claimed in claim 1, wherein the circuitry is configured to buffer a data stream recovered from the broadcast signal for a time interval to synchronize and jointly decode said data stream with the received redundancy data to form the non-real-time event.

5. The receiver as claimed in claim 1, wherein the circuitry is further configured to estimate an amount of redundancy data required to complete the decoding of the content item.

6. The receiver as claimed in claim 1, wherein the circuitry is configured to determine a last correctly decoded packet, and identifying therefrom packet identification information and request subsequent packets as the requested redundancy data.

7. A hybrid broadcast broadband terminal including the receiver of claim 1 wherein the circuitry is further configured to decode a real time event from the broadcast signal.

8. The hybrid broadcast broadband terminal as claimed in claim 7, wherein the circuitry is further configured to output a program schedule indicating that the non-real-time event can be played from a non-transitory storage device controlled by the circuitry.

9. The hybrid broadcast broadband terminal as claimed in claim 7, wherein the circuitry is configured to receive a network delivery indicator and to interpret the delivery network indicator to indicate to the hybrid broadcast broadband terminal over which period of time the non-real time event is to be available.

10. A television including the receiver of claim 1, wherein the circuitry is further configured to output a program schedule indicating that the non-real-time event can be played from a non-transitory storage device controlled by the circuitry.

11. A method comprising:
  receiving, via broadcast receiver circuitry, in a broadcast signal OFDM symbols representing a content item for a non-real-time event;
  decoding the content item and determine whether complete decoding of the content item is possible;
  in response to a determination result that complete decoding of the content item based on the received OFDM symbols is not possible,
    sending a request to a server for redundancy data corresponds to specifically requested bit positions in the received broadcast signal,
    receiving the requested redundancy data via broadband receiver circuitry, and
    completing the decoding of the content item based on the received redundancy data; and
  playing the content item as the non-real time event.

12. The method as claimed in claim 11 wherein the content item is a data service item.

13. The method as claimed in claim 12, wherein the data service item is related to a video content item received via the broadcast circuitry and starting the date service item in relation to the video content item.

14. The method as claimed in claim 11, comprising buffering a data stream recovered from the broadcast signal for a time interval and synchronizing and jointly decoding said data stream with the received redundancy data to form the non-real-time event.

15. The method as claimed in claim 11, comprising estimating an amount of redundancy data required to complete the decoding of the content item.

16. The method as claimed in claim 11, comprising determining a last correctly decoded packet, and identifying therefrom packet identification information and request subsequent packets as the requested redundancy data.

17. The method as claimed in claim 11, comprising receiving a network delivery indicator and interpreting the delivery network indicator to indicate to a hybrid broadcast broadband terminal over which period of time the non-real time event is to be available.

* * * * *